(12) United States Patent
Liu et al.

(10) Patent No.: US 10,854,850 B2
(45) Date of Patent: Dec. 1, 2020

(54) ORGANIC LIGHT-EMITTING DIODE DISPLAY DEVICE

(71) Applicant: TPK Touch Solutions Inc., Taipei (TW)

(72) Inventors: Chen-Yu Liu, Taoyuan (TW); Li-Wei Kung, Taoyuan (TW); Hsi-Chien Lin, Hsinchu (TW)

(73) Assignee: TPK Touch Solutions Inc., Taipei (TW)

( * ) Notice: Subject to any disclaimer, the term of this patent is extended or adjusted under 35 U.S.C. 154(b) by 193 days.

(21) Appl. No.: 15/927,059

(22) Filed: Mar. 20, 2018

(65) Prior Publication Data
US 2018/0277795 A1    Sep. 27, 2018

(30) Foreign Application Priority Data

Mar. 21, 2017    (CN) .......................... 2017 1 0168427

(51) Int. Cl.
*H01L 51/52*    (2006.01)
*H01L 27/32*    (2006.01)

(52) U.S. Cl.
CPC ........ *H01L 51/5268* (2013.01); *H01L 27/322* (2013.01); *H01L 27/323* (2013.01);
(Continued)

(58) Field of Classification Search
CPC .............. H01L 51/5268; H01L 27/322; H01L 51/5246; H01L 51/5284; H01L 51/5234
See application file for complete search history.

(56) References Cited

U.S. PATENT DOCUMENTS

2014/0183458 A1*    7/2014    Lee ......................... H01L 51/56
                                                                257/40
2017/0069870 A1    3/2017    Wang et al.
(Continued)

FOREIGN PATENT DOCUMENTS

KR    100490536 B    5/2005
KR    100696200 B    3/2007
(Continued)

OTHER PUBLICATIONS

Notification of Reason for Refusal and English Translation as cited in KR Application No. KR 10-2018-0032040 dated Feb. 25, 2020, 16 pages.
(Continued)

*Primary Examiner* — Douglas M Menz
(74) *Attorney, Agent, or Firm* — Cooper Legal Group, LLC

(57) ABSTRACT

An OLED display device includes a substrate, an active element array, at least one OLED, a light absorption layer or an optical scattering layer, and an encapsulation plate. The active element array and the OLED are disposed over an upper surface of the substrate. The OLED includes a first electrode, a second electrode, and an organic light-emitting layer. The first electrode is disposed on a side adjacent to the active element array, and the second electrode is opposite to the first electrode. Both the first and second electrodes have a high transmittance and a low reflection in a wavelength range of visible light. The organic light-emitting layer is interposed between the first and second electrodes. The light absorption layer or optical scattering layer is disposed between the OLED and the substrate. The encapsulation plate is disposed over the second electrode.

20 Claims, 30 Drawing Sheets

(52) U.S. Cl.
CPC ...... *H01L 51/5203* (2013.01); *H01L 51/5215* (2013.01); *H01L 51/5234* (2013.01); *H01L 51/5246* (2013.01); *H01L 51/5284* (2013.01); *H01L 27/3258* (2013.01); *H01L 2251/5369* (2013.01)

(56) References Cited

U.S. PATENT DOCUMENTS

2017/0279084 A1* 9/2017 Sakamoto ............. H01L 27/322
2018/0047791 A1* 2/2018 Tsai ..................... H01L 27/322

FOREIGN PATENT DOCUMENTS

| KR | 20080001999 A | 1/2008 |
| KR | 20100033866 A | 3/2010 |
| KR | 20120044655 A | 5/2012 |
| KR | 20120062374 A | 6/2012 |
| KR | 20130006936 A | 1/2013 |
| KR | 20140073809 A | 6/2014 |
| KR | 20160010199 A | 1/2016 |
| KR | 20170005252 A | 1/2017 |

OTHER PUBLICATIONS

Notice of Final Rejection and English Translation as cited in KR Application No. KR 10-2018-0032040 dated Dec. 27, 2019, 8 pages.

* cited by examiner

ORGANIC LIGHT-EMITTING DIODE DISPLAY DEVICE

RELATED APPLICATIONS

This application claims priority to China Application Serial Number 201710168427.6, filed Mar. 21, 2017, which is herein incorporated by reference.

FIELD OF DISCLOSURE

The present disclosure relates to an organic light-emitting diode (OLED) display device.

BACKGROUND

OLED display panels are regarded as mainstream technology for the next generation. In typical OLED display panels, light from the outside reflected by panels will seriously affect pictures originally displayed by displays when users look at OLED displays in a high brightness environment. The users thus cannot see the original display pictures clearly.

In a traditional OLED display, a material having a high reflectance is used in drive electrodes of organic light-emitting diodes (OLEDs) to increase the light extraction efficiency, such that light emitted towards panel bottoms can be reflected by the drive electrodes underneath to obtain a higher light extraction efficiency. In addition, some have proposed the OLED display having micro-optical resonators to increase the brightness of the OLED display. In this type of technology, not only does a highly reflective material need to be used in lower drive electrodes of OLEDs, but upper drive electrodes also must have a certain reflectance. The OLED display having micro-optical resonators can provide better color saturation and higher brightness at an orthographic angle, however, there are also some disadvantages. For example, although the brightness and color saturation of the display along an orthographic direction are increased, color distortion of images at a large viewing angle is caused. Additionally, the brightness abruptly decreases with the increase of the viewing angle.

In the above technology, some problems have been caused although a high light extraction efficiency is obtained. For example, the highly reflective electrodes will reflect light incident from the outside, so that the light from the outside reflected by a panel will seriously affect pictures originally displayed by the display when users are located in an environment of high brightness light source (such as outdoor sunlight). As a result, the users cannot clearly see the pictures originally displayed by the display. In addition to that, in the technology of micro-optical resonators, although this type of technology can provide better color saturation and higher brightness at an orthographic angle, it also faces the same problem because highly reflective electrodes need to be used.

In order to solve the above problems, an antireflective optical module is added above a display face of the OLED display in some configurations so as to reduce the reflecting of light from the outside by the OLED panel. This kind of antireflective optical module is constituted by a polarizer and a ¼λ wave plate. Although the antireflective optical module having this specific structure resolves the reflecting problem of the light from the outside, the structure also results in a brightness loss of the OLED panel of up to 60%, which is caused by the transmittance of only 40-50% transmittance of a single polarizer. Hence, such configurations have the disadvantage that a dilemma exists between the light extraction efficiency and the use in an environment of high brightness light source. In addition, the stack structure in such configurations increases the thickness and weight of the overall device.

For the forgoing reasons, there is a need to solve the above-mentioned technical problem by providing a new OLED display panel

SUMMARY

One or more embodiments of the present disclosure disclosed as follows can resolve the reflecting problem of the environmental light. Not only can the embodiments of the present disclosure increase the overall luminous efficiency of the OLED display device or the OLED touch device, but the embodiments of the present disclosure can also be used in the environment of high brightness light source.

An OLED display device is provided. The OLED display device comprises a substrate, an active element array, at least one OLED, a light absorption layer, and an encapsulation plate. The substrate has an upper surface and a lower surface opposite to each other. The active element array is disposed on the upper surface of the substrate. The OLED is disposed on the substrate. The OLED comprises a first electrode, a second electrode, and an organic light-emitting layer. The first electrode is disposed on one side adjacent to the active element array. The second electrode is disposed opposite to the first electrode. The organic light-emitting layer is interposed between the first electrode and the second electrode. The light absorption layer is disposed between the OLED and the upper surface of the substrate, or disposed on the lower surface of the substrate. The encapsulation plate is disposed over the second electrode.

The disclosure provides an OLED display device. The OLED display device comprises a substrate, an active element array, at least one OLED, an optical scattering layer, and an encapsulation plate. The substrate has an upper surface and a lower surface opposite to each other. The active element array is disposed on the upper surface of the substrate. The OLED is disposed above the active element array. The OLED comprises a first electrode, a second electrode, and an organic light-emitting layer. The first electrode is disposed on one side adjacent to the active element array. The second electrode is disposed opposite to the first electrode. The organic light-emitting layer is interposed between the first electrode and the second electrode. The optical scattering layer is disposed between the OLED and the upper surface of the substrate, or disposed on the lower surface of the substrate. The encapsulation plate is disposed over the second electrode.

The disclosure further provides an OLED display device. The OLED display device comprises a substrate, an active element array, at least one OLED, and an encapsulation plate. The substrate has an upper surface and a lower surface opposite to each other. The active element array is disposed on the upper surface of the substrate. The OLED is disposed on the substrate. The OLED comprises a first electrode, a second electrode, and an organic light-emitting layer. The first electrode is disposed on one side adjacent to the active element array, and the first electrode comprises a plurality of nanoscale conductive wires for scattering incident light. The second electrode is disposed opposite to the first electrode. The organic light-emitting layer is interposed between the first electrode and the second electrode. The encapsulation plate is disposed over the second electrode.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
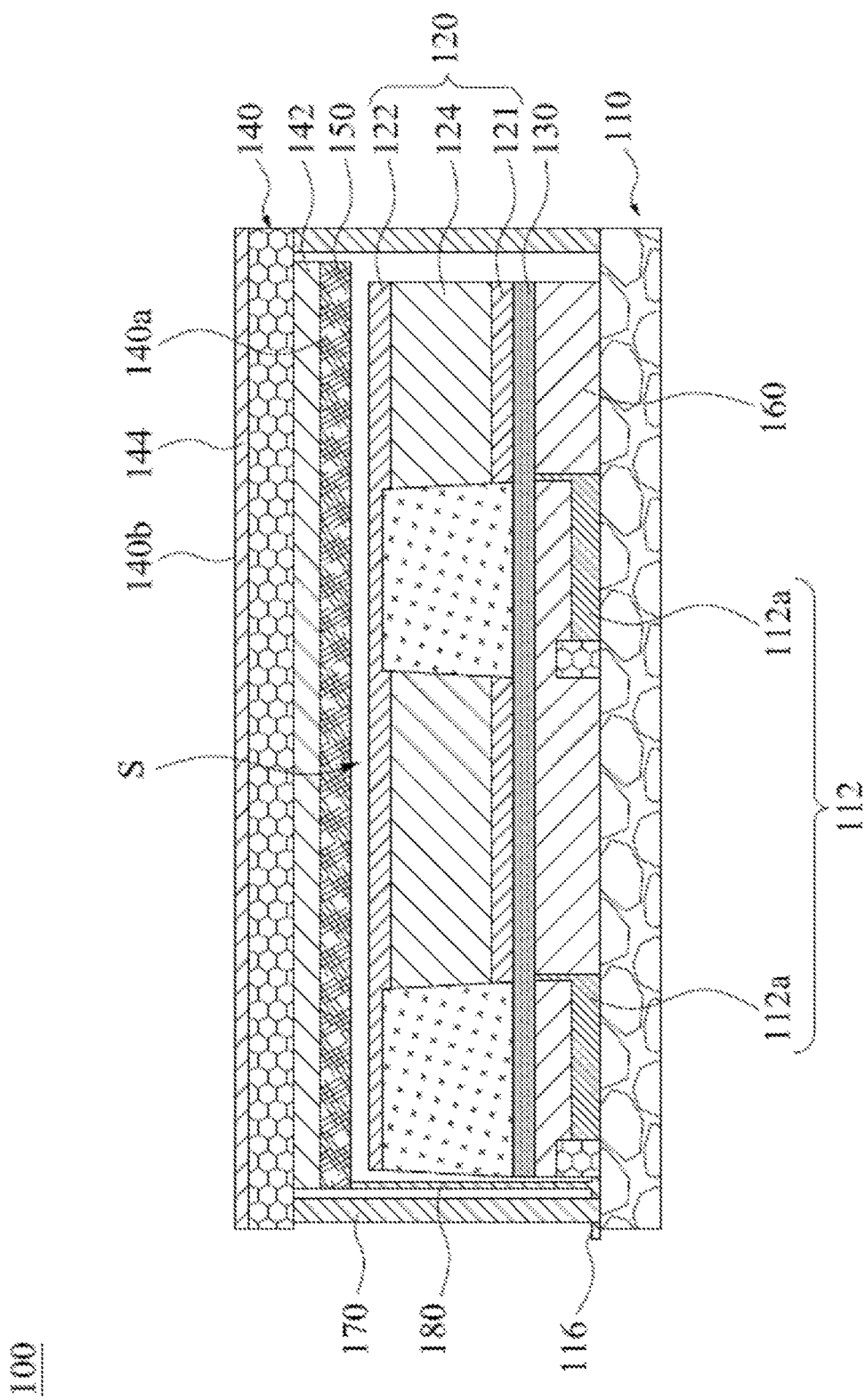
FIG. 1 depicts a cross-sectional schematic diagram of an OLED touch device according to various embodiments of this disclosure.

Reference will now be made in detail to the present embodiments of the disclosure, examples of which are illustrated in the accompanying drawings. Wherever possible, the same reference numbers are used in the drawings and the description to refer to the same or like parts. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

As used herein, terms like "around," "about" or "approximately" shall generally mean within about 20 percent, preferably within about 10 percent, and more preferably within about 5 percent of a given value or range. Numerical quantities given herein are approximate, meaning that the term "around," "about" or "approximately" can be inferred if not expressly stated. It will also be understood that, when an element is referred to as being "connected" or "coupled" to another element, it can be directly connected or coupled to another element or one or more extra elements may be present therebetween. That is, one element is connected to another element via one or more extra elements. In contrast, when an element is referred to as being "directly connected" or "directly coupled" to another element, there are no extra elements present. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer and/or section from another element, component, region, layer and/or section. Thus, a first element, component, region, layer and/or section discussed below could be termed a second element, component, region, layer and/or section.

In one or more embodiments of the present disclosure disclosed below, the concept of using traditionally highly reflective electrodes is abandoned, and rather, a material having a low optical reflectance and a high optical transmittance is used as drive electrodes of OLEDs. Further, a light absorption layer or an optical scattering layer is disposed. In one or more embodiments of the present disclosure disclosed below, not only is the problem of light reflecting from the outside caused by the highly reflective drive electrodes avoided, but the plug-in antireflective optical module is also not required. As a result, the overall luminous efficiency is increased by approximately 25% (as compared with configurations which have the plug-in antireflective optical module).

FIG. 1 depicts a cross-sectional schematic diagram of an OLED touch device 100 according to various embodiments of this disclosure. The OLED touch device 100 includes an active array substrate 110, one or more OLEDs 120, a light absorption layer 130, an encapsulation plate 140, and a touch circuit layer 150.

The active array substrate 110 includes a plurality of active elements 112a. The active elements 112a may be located on an upper surface of the active array substrate 110, and the active elements 112a may be disposed in a matrix to form an active element array 112. In some embodiments, the active elements 112a may be, for example, polysilicon thin film transistors, amorphous silicon thin film transistors, or metal oxide thin film transistors.

The OLED 120 is disposed on the active array substrate 110. The OLED 120 includes a first electrode 121, a second electrode 122, and an organic light-emitting layer 124.

The first electrode 121 is disposed on one side adjacent to the active element array 112. The second electrode 122 is disposed opposite to the first electrode 121. In some embodiments, the first electrode 121 and the second electrode 122 are made of a material having a low reflectance and a high transmittance. In some embodiments, an average transmittance of the first electrode 121 and the second electrode 122 in a wavelength range of visible light (380 nm-780 nm) is greater than approximately 0.6. The material of the first electrode 121 and/or the second electrode 122 may be, for example, indium tin oxide (ITO), indium zinc oxide (IZO), aluminum zinc oxide (AZO), indium tin zinc oxide (ITZO), cadmium tin oxide (CTO), tin oxide, zinc oxide, cadmium oxide, indium gallium zinc oxide (InGaZnO), indium gallium zinc magnesium oxide (InGaZnMgO), indium gallium aluminum oxide (InGaAlO), or indium gallium magnesium oxide (InGaMgO), etc, but the present disclosure is not limited in this regard.

The organic light-emitting layer 124 is interposed between the first electrode 121 and the second electrode 122. In some embodiments, the organic light-emitting layer 124 is a multi-layered structure. For example, the organic light-emitting layer 124 may include a hole injection layer (HIL), a hole transport layer (HTL), an emitting layer (EML), a hole blocking layer (HBL), and an electron transport layer (ETL), etc., but the present disclosure is not limited in this regard.

The light absorption layer 130 is located between the first electrode 121 and the active element array 112. The light absorption layer 130 is used for absorbing light incident to the OLED touch device 100 from the environment. As mentioned above, the first electrode 121 and the second electrode 122 of the OLED 120 are made of a conductive material having the high transmittance and the low reflectance. Hence, this kind of electrode having the high transmittance provides a higher transmittance along a light direction of a display surface without hindering or absorbing light emitted from the OLED 120. As for incident light from the outside, the reflecting of light incident from the environment can be reduced because of the low reflectance. In addition, the light absorption layer 130 is disposed on the active array substrate 110. After light incident to a panel from the external environment passes through the first electrode 121 and the second electrode 122 having the high transmittance and the low reflectance and reaches the light absorption layer 130, the incident light is absorbed by the light absorption layer 130. Therefore, the optical reflection of the incident light that originally would occur can be reduced or eliminated to increase the brightness contrast of an OLED display. As a result, the present disclosure does not need to dispose an extra antireflective optical film or module, the luminous intensity of the OLED 120 thus will not be reduced, and the thickness and weight of the overall OLED touch device 100 will not be obviously increased.

In some embodiments, a material of the light absorption layer 130 may include an organic and/or inorganic material, such as dye, pigment, graphite carbon, titanium black, carbon black and/or cesium tungsten oxide. A particle size may be, for example, from about 10 nanometers to about 2 micrometers, but the present disclosure is not limited in this regard.

In at least one embodiment, the light absorption layer 130 completely covers the active element array 112, and an average reflectance of the light absorption layer 130 in the wavelength range of visible light is less than approximately 0.3, or an absorptance of the light absorption layer 130 in the wavelength range of visible light is greater than approximately 0.6.

The encapsulation plate 140 is disposed over the second electrode 122, and the encapsulation plate 140 and the active array substrate 110 form a closed space S to isolate the OLED 120 from the outside so as to avoid deterioration of the OLED 120. In greater detail, the organic light-emitting layer 124 and a cathode in the OLED 120 are usually made of materials vulnerable to deterioration from water and/or oxygen. Hence, if water or oxygen penetrates into an OLED display, the lifetime of the display will be seriously affected. In consideration of this, the encapsulation plate 140 needs to be disposed for the OLED 120 to avoid the elements in the OLED 120 contacting oxygen and/or moisture from the outside.

The encapsulation plate 140 may include a rigid substrate, such as glass, or a flexible substrate, such as polycarbonate (PC), polyethylene terephthalate (PET), polymethylmesacrylate (PMMA), polysulfone (PES), or a cyclic olefin copolymer.

In some embodiments, the OLED touch device 100 includes a sealing layer 170 disposed between the encapsulation plate 140 and the active array substrate 110, and the sealing layer 170 surrounds the active element array 112 and the OLED 120. The sealing layer 170, the encapsulation plate 140, and the active array substrate 110 form a closed space S to prevent water and/or oxygen in the environment from entering into an inside of the OLED touch device 100. An inner side face 140a of the encapsulation plate 140 is thus formed in the closed space S.

In some embodiments, the encapsulation plate 140 further includes a refractive index matching layer 142 disposed on the inner side face 140a of the encapsulation plate 140. In at least one embodiment, the refractive index matching layer 142 includes a number of high refractive index material layers and a number of low refractive index material layers. The high refractive index material layers and the low refractive index material layers are alternately stacked to form the refractive index matching layer 142. The high refractive index material layer may be, for example, titanium dioxide. The low refractive index material layer may be, for example, silicon oxide, but the present disclosure is not limited in this regard.

In some embodiments, the encapsulation plate 140 further includes a glass plate 144 disposed on an outer side face 140b of the encapsulation plate 140. The glass plate 144 has high hardness to avoid the abrasion of the encapsulation plate 140.

The touch circuit layer 150 is disposed on the inner side face 140a of the encapsulation plate 140 for detecting a position of at least one contact point on the outer side face 140b of the encapsulation plate 140. The touch circuit layer 150 may be, for example, a capacitive sensing circuit in a bridge structure, a single-layered capacitive sensing circuit, or other types of sensing circuits. The detailed structure of the touch circuit layer 150 is described in more detail hereinafter.

In some embodiments, the active array substrate 110 further includes a passivation layer 160. The passivation layer 160 covers the active element array 112 so that the light absorption layer 130 is interposed between the passivation layer 160 and the first electrode 121. The passivation layer 160 may include an inorganic material, such as silicon nitride, silicon oxide, or silicon oxynitride, or an organic material, such as polyimide, acrylic resin, or some other suitable material. However, the present disclosure is not limited in this regard.

In some embodiments, the OLED touch device 100 further includes an electrical connection element 180 for transmitting an electric signal with respect to the contact point detected by the touch circuit layer 150 to a microprocessing unit (not shown in the figure).

In some embodiments, the active array substrate 110 further includes a signal line 116. The signal line 116 passes through the sealing layer 170 from an edge of the active array substrate 110 and extends to a position between the active element array 112 and the sealing layer 170. In addition, the electrical connection element 180 extends from the touch circuit layer 150 to the position of the signal line 116 through the space between the sealing layer 170 and the active element array 112 so that the touch circuit layer 150 is electrically connected to the signal line 116. In some embodiments, the signal line 116 and the active element array 112 are concurrently formed. Hence, a material of the signal line 116 is the same as a material of a metal layer in the active elements 112a. The material of the signal line 116 may be, for example, conductive metal such as aluminum, molybdenum, copper, chrome, silver, or combinations thereof, but the present disclosure is not limited in this regard.

Figure 2:
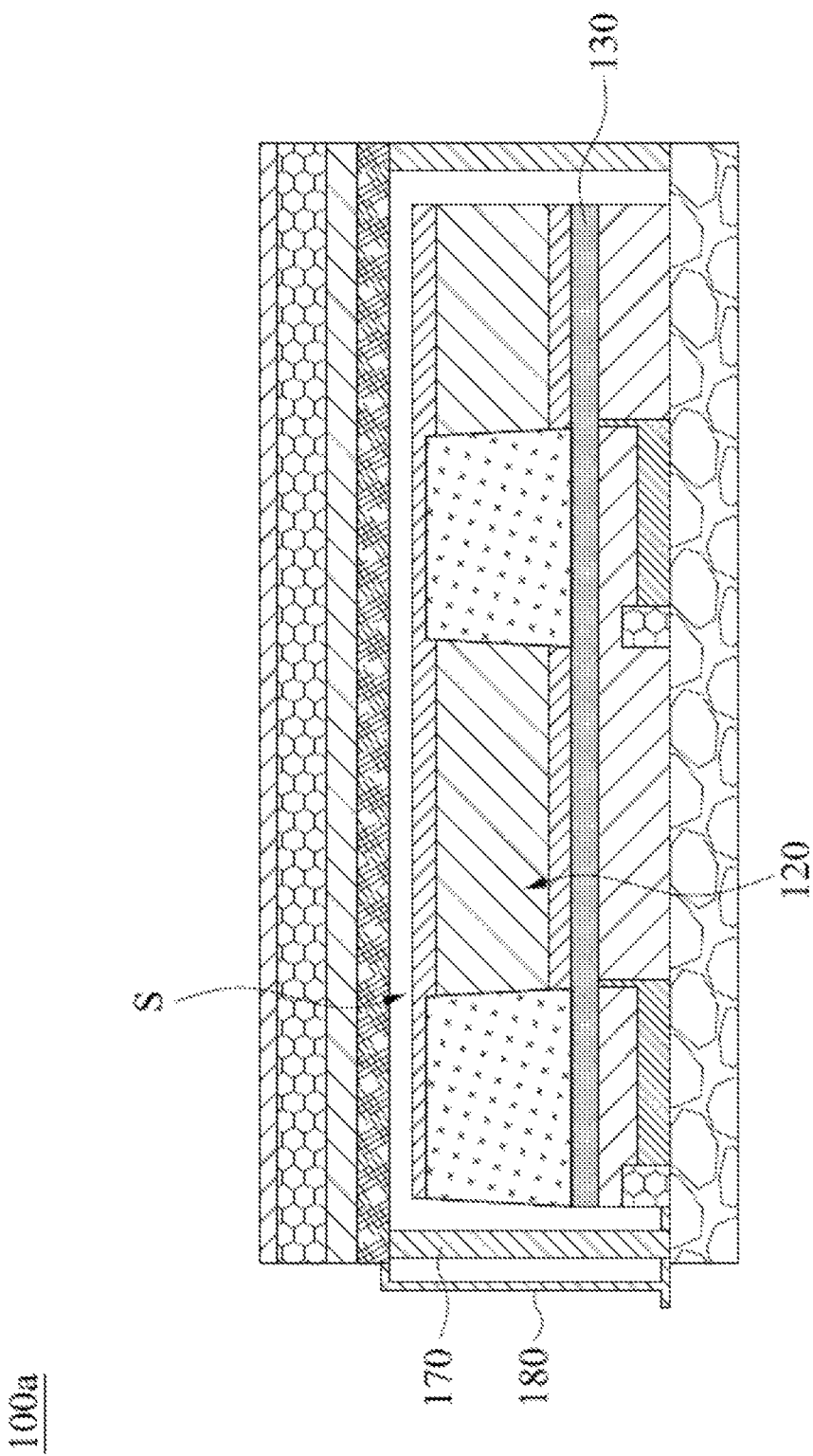
FIG. 2 depicts a cross-sectional schematic diagram of an OLED touch device according to another embodiment of this disclosure.

In some other embodiments, as shown in FIG. 2, the electrical connection element 180 of an OLED touch device 100a may be disposed outside the closed space S rather than in the closed space S. In other words, the electrical connection element 180 and the OLED 120 are respectively disposed on opposite sides of the sealing layer 170. The electrical connection element 180 may be, for example, a flexible print circuit or some other suitable electrical connection element.

Figure 3:
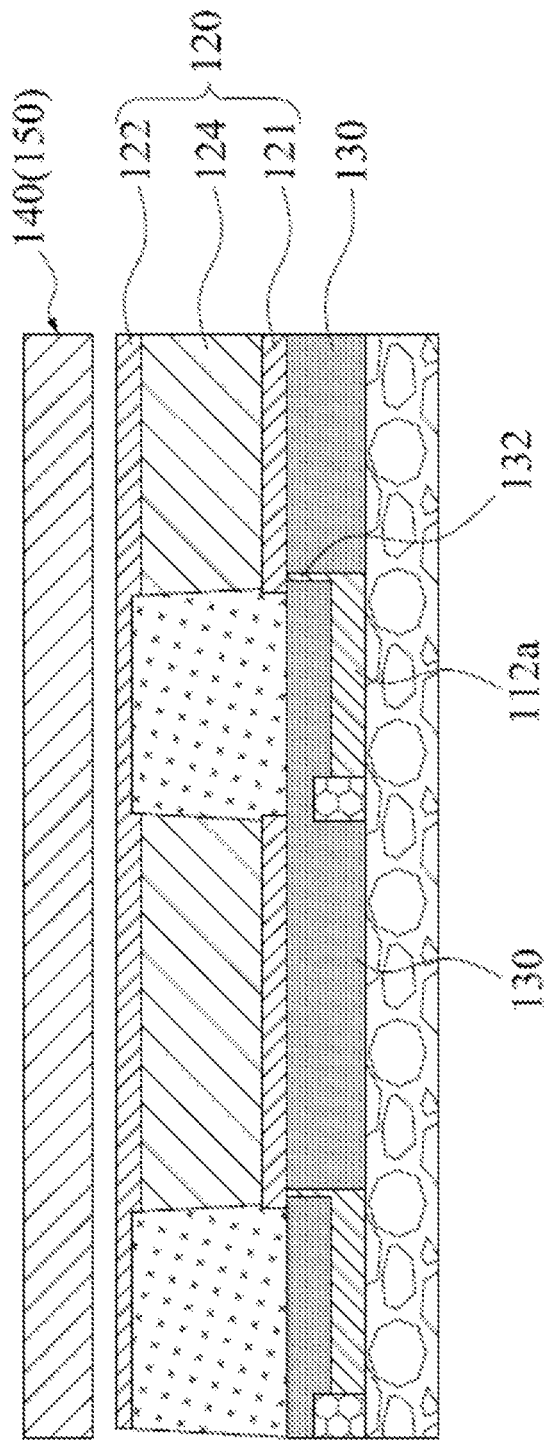
FIG. 3 depicts a cross-sectional schematic diagram of an OLED touch device according to still another embodiment of this disclosure.

FIG. 3 depicts a cross-sectional schematic diagram of an OLED touch device 100b according to still another embodiment of this disclosure. The main difference between the OLED touch device 100b and the above OLED touch device 100 is that the light absorption layer 130 directly replaces the passivation layer 160 depicted in FIG. 1. In greater detail, the light absorption layer 130 is made of an insulating material and contacts the active element array 112. The light absorption layer 130 has at least one via hole 132 to allow the active element array 112 and the first electrode 121 to be electrically connected through a conductive material filled in the via hole 132. For example, during the depositing of forming the first electrode 121, a material of the first electrode 121 is deposited and filled in the via hole 132 so that the first electrode 121 is electrically connected to the active element 112a. The other elements of the OLED touch device 100b have the same characteristics as those described previously in the OLED touch device 100. To simplify the drawing, the encapsulation plate 140 and the touch circuit layer 150 in FIG. 3 are schematically depicted as a single element.

Figure 4:
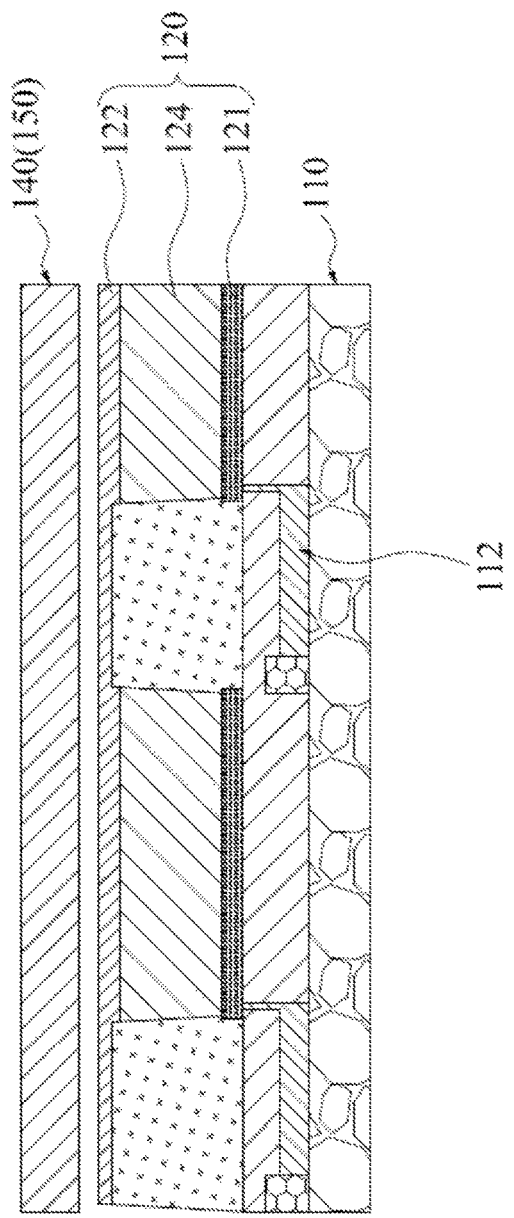
FIG. 4 depicts a cross-sectional schematic diagram of an OLED touch device according to yet another embodiment of this disclosure.

FIG. 4 depicts a cross-sectional schematic diagram of an OLED touch device 100c according to yet another embodiment of this disclosure. The OLED touch device 100c includes the active array substrate 110, the OLED 120, the encapsulation plate 140, and the touch circuit layer 150. The active array substrate 110, the encapsulation plate 140, and the touch circuit layer 150 of the OLED touch device 100c have the same characteristics as the corresponding elements of the OLED touch device 100. To simplify the drawing, the encapsulation plate 140 and the touch circuit layer 150 in FIG. 4 are schematically depicted as a single element. In the present embodiment, the major difference between the OLED touch device 100c and the OLED touch device 100a is that the first electrode 121 of the OLED touch device 100c provides a function of absorbing light. In other words, the light absorption layer 130 and the first electrode 121 of the OLED 120 depicted in FIG. 1 are integrated into a single-layered structure. Thus, there is no necessity to dispose an extra light absorption layer. In greater detail, the OLED 120 includes the first electrode 121, the second electrode 122, and the organic light-emitting layer 124. The first electrode 121 is disposed on a side adjacent to the active element array 112. The first electrode 121 includes a conductive material and provides a function of absorbing light. In at least one embodiment, the first electrode 121 is made of a material having a high optical absorptance, and the optical absorptance of the first electrode 121 is greater than approximately 0.6 while a transmittance thereof is less than approximately 0.3, in the wavelength range of visible light. The second electrode 122 is opposite to the first electrode 121. The second electrode 122 is made of a material having a high transmittance and a low reflectance. For example, an average transmittance of the second electrode 122 in the wavelength range of visible light is greater than approximately 0.6. The organic light-emitting layer 124 is interposed between the first electrode 121 and the second electrode 122. The first electrode 121 and the second electrode 122 can drive the organic light-emitting layer 124 to emit light. Hence, the first electrode 121 according to the present embodiment has both functions of a light absorption layer and an electrode. The second electrode 122 of the OLED 120 is made of a conductive material with a high transmittance and a low reflectance. Hence, in a light-emitting direction of a display surface, the second electrode 122 provides a high transmittance, without considerably hindering or absorbing light emitted from the OLED 120. As for incident light from the outside, the direct reflection of light incident from the environment can be reduced because of the low reflectance of the second electrode 122. After light incident from the external environment passes through the second electrode 122 with the high transmittance and reaches the first electrode 121 having the light absorption capability, the incident light passing through the second electrode 122 and the organic light-emitting layer 124 is absorbed by the first electrode 121. Therefore, the optical reflection can be reduced and eliminated so as to increase the brightness contrast of the OLED 120. As a result, the present disclosure does not need to dispose an extra antireflective optical film or module, the luminous intensity originally emitted by the OLED 120 thus will not be reduced, and the thickness and weight of the overall OLED touch device 100c will not be obviously increased.

Figure 7:
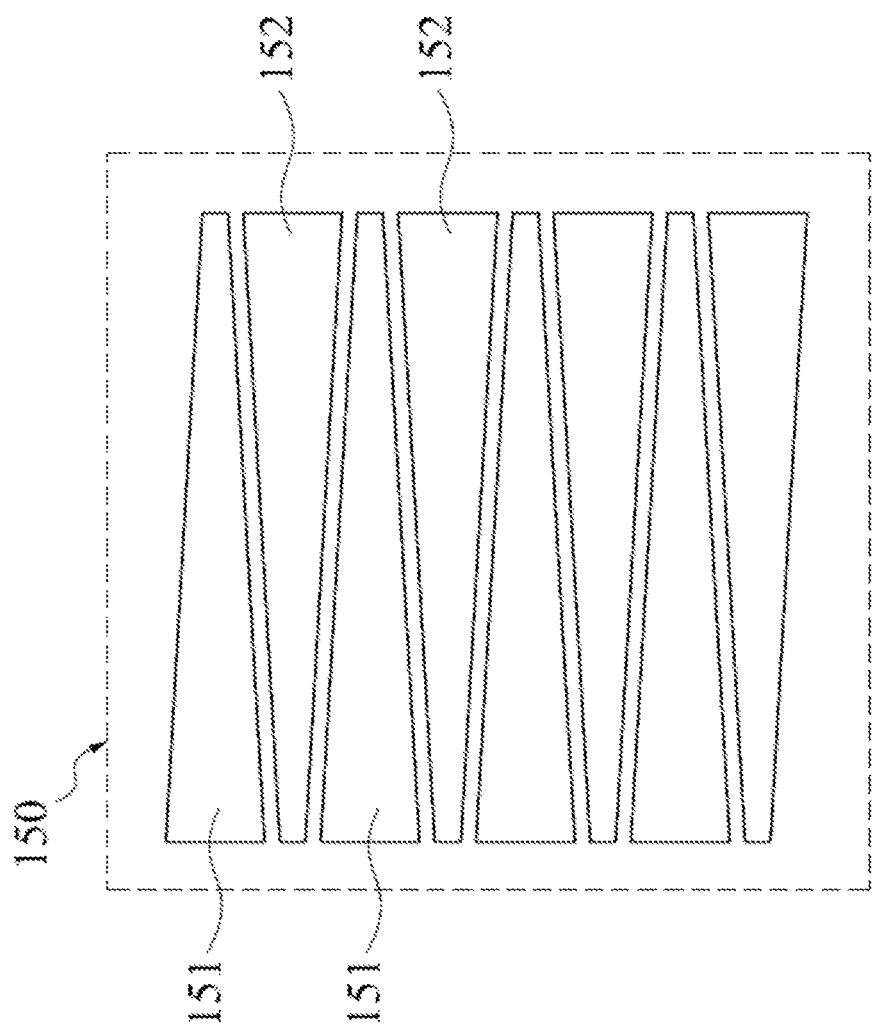
FIG. 7 depicts a top schematic diagram of a touch circuit layer according to still another embodiment of this disclosure.
Figure 8:
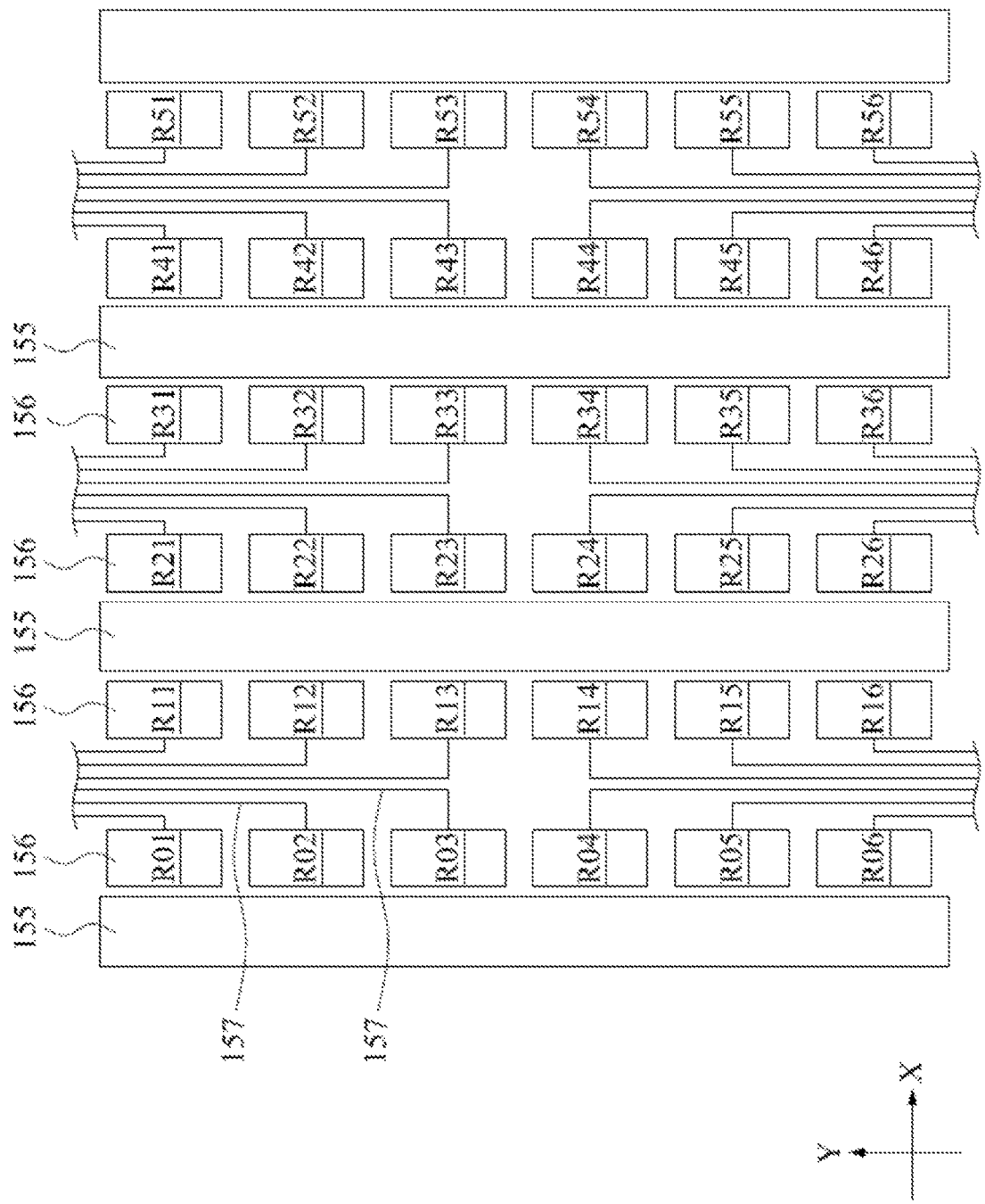
FIG. 8 depicts a top schematic diagram of a touch circuit layer according to yet another embodiment of this disclosure.

There is no specific limitation to the touch circuit layer 150 according to the present disclosure. A capacitive sensing circuit in a bridge structure, a single-layered capacitive sensing circuit, or other types of sensing circuit can be used in one or more embodiments of the present disclosure. FIGS. 5A, 5B, 6A, and 6B depict capacitive sensing circuits in bridge structures according to various embodiments of this disclosure. FIGS. 7 and 8 depict single-layered capacitive sensing circuits according to various embodiments of this disclosure. A detailed description is provided as follows.

Figure 5A:
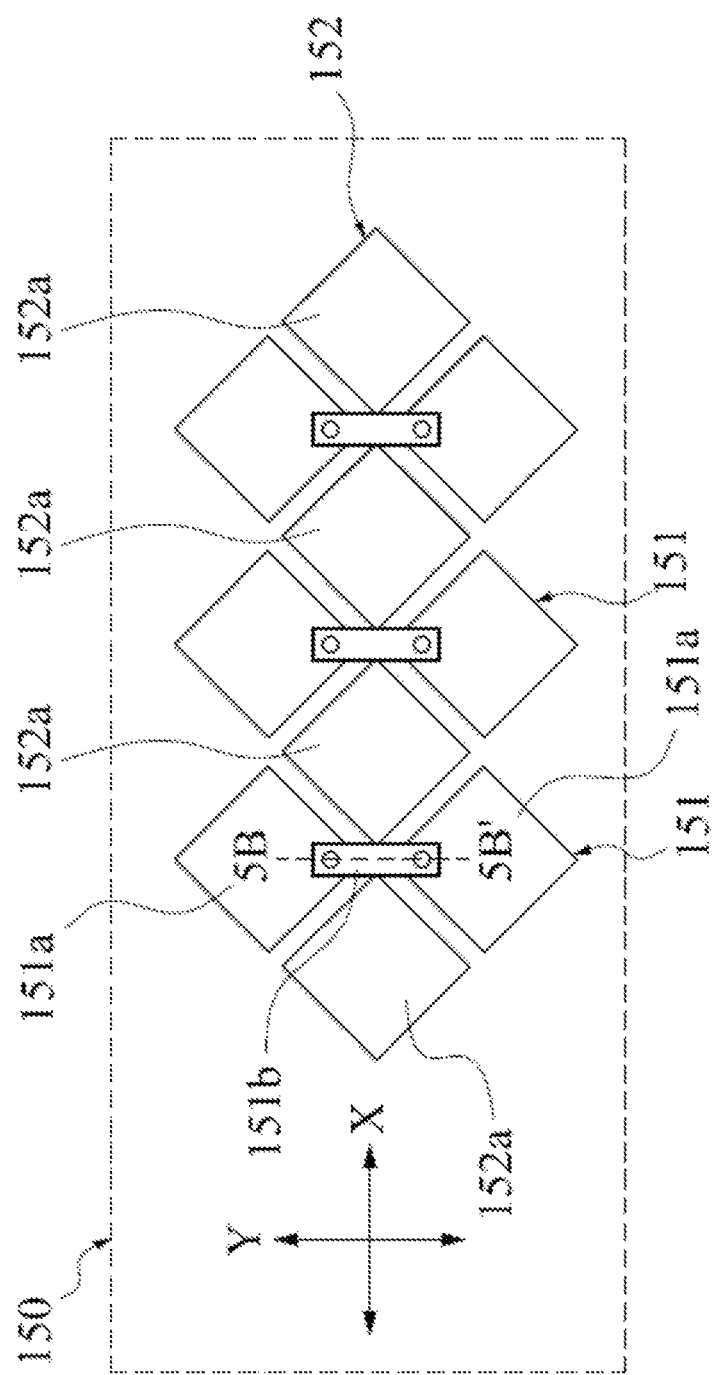
FIG. 5A depicts a top schematic diagram of a touch circuit layer according to one embodiment of this disclosure.
Figure 5B:
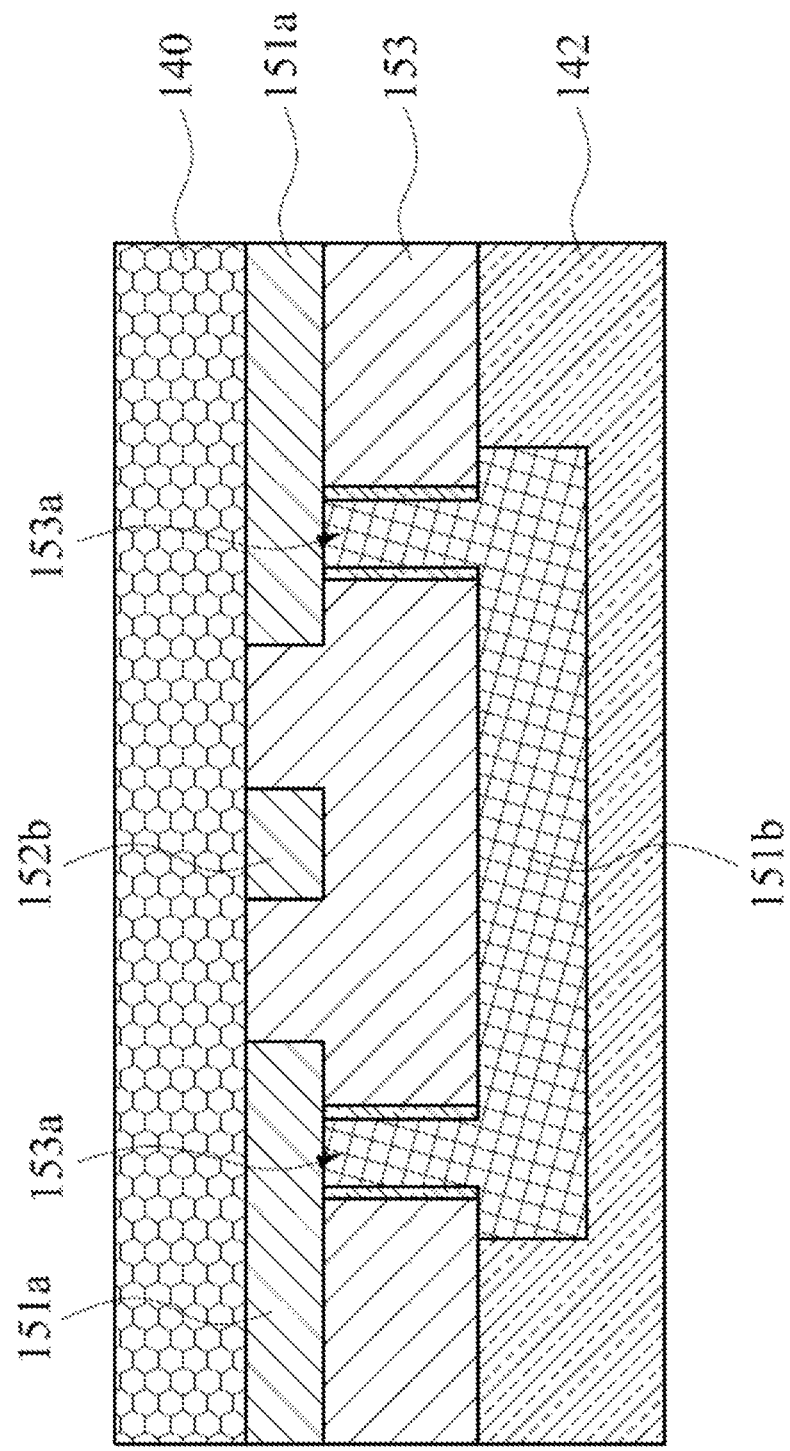
FIG. 5B depicts a cross-sectional schematic diagram taken along line 5B-5B' in FIG. 5A.

FIG. 5A depicts a top view schematically illustrating the touch circuit layer 150 according to one embodiment of this disclosure. FIG. 5B depicts a cross-sectional view taken along line 5B-5B' in FIG. 5A. The touch circuit layer 150 includes a plurality of first sensing electrodes 151 and a plurality of second sensing electrodes 152. Each of the first sensing electrodes 151 extends along Y direction, and each of the second sensing electrodes 152 extends along X direction. With reference to FIG. 5A and FIG. 5B, each of the first sensing electrodes 151 includes a plurality of first sensing pads 151 and a plurality of first bridging lines 151b. Two adjacent ones of the first sensing pads 151a are connected in series by one of the first bridging lines 151b so as to form the first sensing electrode 151. Similarly, each of the second sensing electrodes 152 includes a plurality of second sensing pads 152a and a plurality of second bridging lines 152b. Two adjacent ones of the second sensing pads 152a are connected in series by one of the second bridging lines 152b so as to form the second sensing electrode 152. The second bridging lines 152b and the second sensing pads 152 are formed on the same plane. In some embodiments, the touch circuit layer 150 further includes a dielectric layer 153 and a refractive index matching layer 142. The dielectric layer 153 may be, for example, a planer layer with a structure to cover the first sensing pads 151a, the second sensing pads 152a, and the second bridging lines 152b. The dielectric layer 153 further has a plurality of via holes 153a. Each of the via holes 153a exposes a part of one of the first sensing pads 151a. The first bridging line 151b is disposed on the dielectric layer 153 and connects two adjacent first sensing pads 151a via two adjacent via holes 153a. A material of the first sensing electrodes 151 and the second sensing electrodes 152 may be, for example, indium tin oxide (ITO), indium zinc oxide (IZO), aluminum zinc oxide (AZO), indium tin zinc oxide (ITZO), cadmium tin oxide (CTO), tin oxide, zinc oxide, cadmium oxide, indium gallium zinc oxide (InGaZnO), indium gallium zinc magnesium oxide (InGaZnMgO), indium gallium aluminum oxide (InGaAlO), or indium gallium magnesium oxide (InGaMgO), etc, but the present disclosure is not limited in this regard.

The refractive index matching layer 142 covers the dielectric layer 153 and the first bridging lines 151b. The refractive index matching layer 142 may includes a multi-layered structure, for example, the refractive index matching layer 142 includes a structure in which multiple high refractive index layers and multiple low refractive index layers are alternately stacked. For example, the refractive index matching layer 142 is formed by alternately stacking a number of titanium dioxide layers and a number of silicon oxide layers. The refractive index matching layer 142 is used for reducing the visibility of the first sensing electrodes 151 and the second sensing electrodes 152 to human eyes.

Figure 6A:
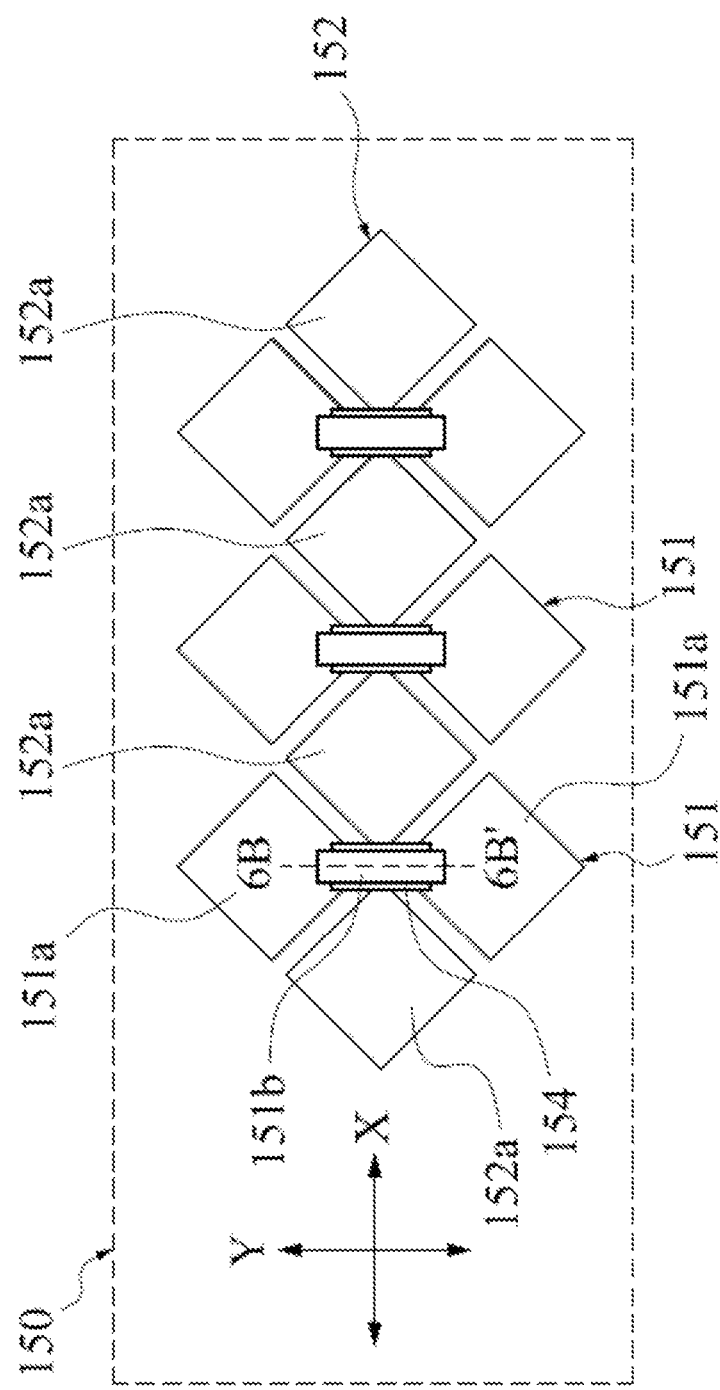
FIG. 6A depicts a top schematic diagram of a touch circuit layer according to another embodiment of this disclosure.
Figure 6B:
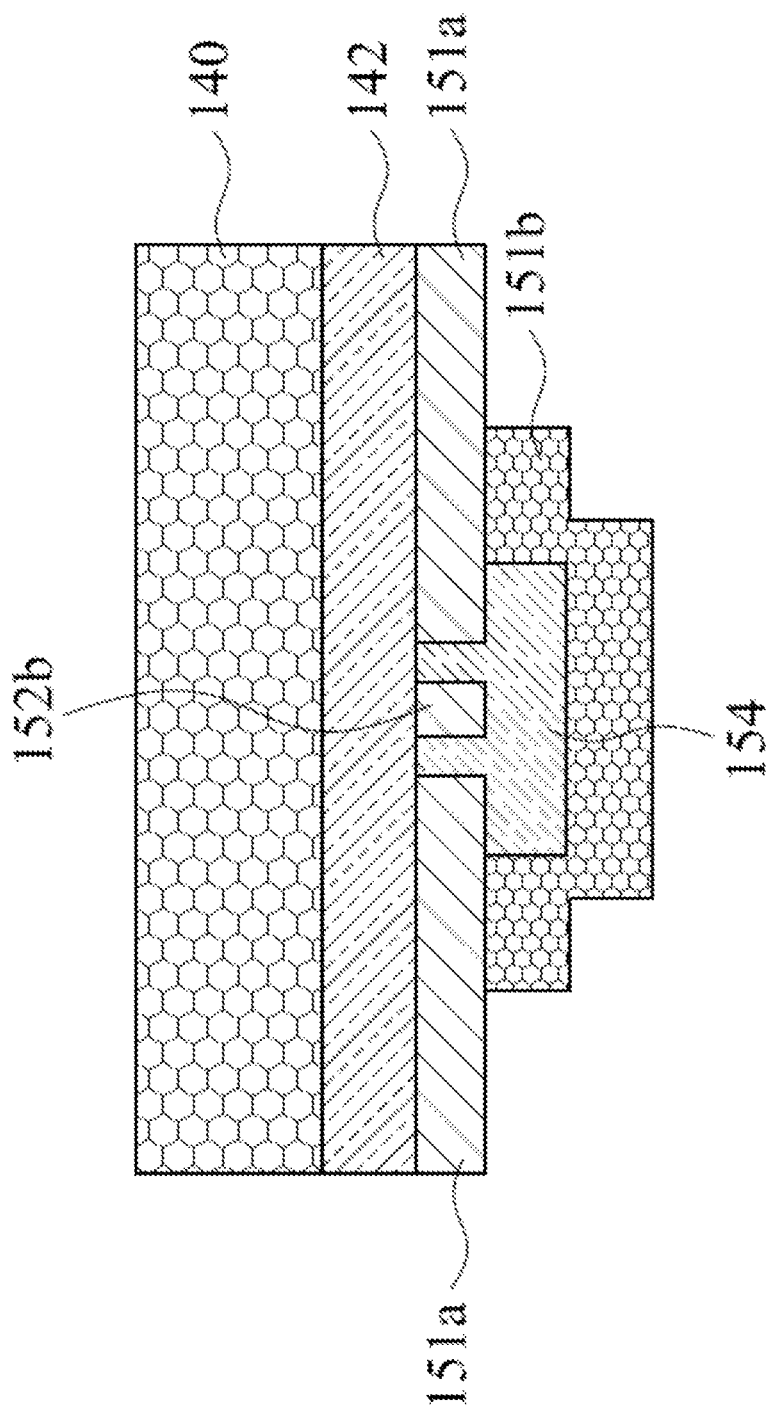
FIG. 6B depicts a cross-sectional schematic diagram taken along line 6B-6B' in FIG. 6A.

FIG. 6A depicts a top schematic diagram of the touch circuit layer 150 according to another embodiment of this disclosure. FIG. 6B depicts a cross-sectional schematic diagram taken along line 6B-6B' in FIG. 6A. The touch circuit layer 150 includes a plurality of first sensing electrodes 151 and a plurality of second sensing electrodes 152. Each of the first sensing electrodes 151 extends along Y direction, and each of the second sensing electrodes 152 extends along X direction. With reference to FIG. 6A and FIG. 6B, each of the first sensing electrodes 151 includes a plurality of first sensing pads 151 and a plurality of first bridging lines 151b. Two adjacent ones of the first sensing pads 151a are connected in series by one of the first bridging lines 151b so as to form the first sensing electrode 151. In addition, each of the second sensing electrodes 152 includes a plurality of second sensing pads 152a and a plurality of second bridging lines 152b. Two adjacent ones of the second sensing pads 152a are connected in series by one of the second bridging lines 152b so as to form the second sensing electrode 152. The second bridging lines 152b and the second sensing pads 152 are formed on the same plane. In the present embodiment, the touch circuit layer 150 further includes a refractive index matching layer 142 and a plurality of insulating layers 154. The insulating layers 154 are located at positions where the first sensing electrodes 151 cross the second sensing electrodes 152, and each of the insulating layers 154 covers edge portions of two adjacent first sensing pads 151a and covers the second bridging line 152b correspondingly located at the position. The first bridging line 151b crosses over the insulting layer 154 from an edge of one of the first sensing pads 151a to another one of the first sensing pads 151a. The refractive index matching layer 142 is interposed between the encapsulation plate 140 and each of the sensing pads 151a, 152a.

FIG. 7 depicts a top schematic diagram of the touch circuit layer 150 according to still another embodiment of this disclosure. The touch circuit layer 150 is a single-layered structure according to the present embodiment. The touch circuit layer 150 includes a plurality of first sensing electrodes 151 and a plurality of second sensing electrodes 152. The first sensing electrodes 151 and the second sensing electrodes 152 are in a wedge-shaped pattern (or in a trapezoidal pattern), and the first sensing electrodes 151 and the second sensing electrodes 152 are alternately arranged. The wedge-shaped first sensing electrodes 151 and second sensing electrodes 152 extend on a same plane and do not overlap each other.

FIG. 8 depicts a top schematic diagram of the touch circuit layer 150 according to yet another embodiment of this disclosure. In the present embodiment, the touch circuit layer 150 is a single-layered structure. The touch circuit layer 150 includes a plurality of sending electrodes 155 and a plurality of receiving electrodes 156. The sending electrodes 155 are used to send and transmit an electric signal for detecting a position of a contact point, and the receiving electrodes 156 are used to sense and receive an electric signal generated by the contact point. The sending electrodes 155 and the receiving electrodes 156 extend on the same plane, and the sending electrodes 155 and the receiving electrodes 156 do not overlap each other. Each of the sending electrodes 155 extends along Y direction, and there is spacing between each of the sending electrodes 155 and another one of the sending electrodes 155 adjacent to the each of the sending electrodes 155. Each of the receiving electrodes 156 is disposed between two adjacent sending electrodes 155. In addition, the touch circuit layer 150 further includes a plurality of signal lines 157. Each of the signal lines 157 is connected to one of the receiving electrodes 156. The electric signal sensed by the receiving electrode 156 is transmitted to one or more microprocessing units (not shown in the figure) via the signal line 157 to calculate the position of the contact point.

Figure 9:
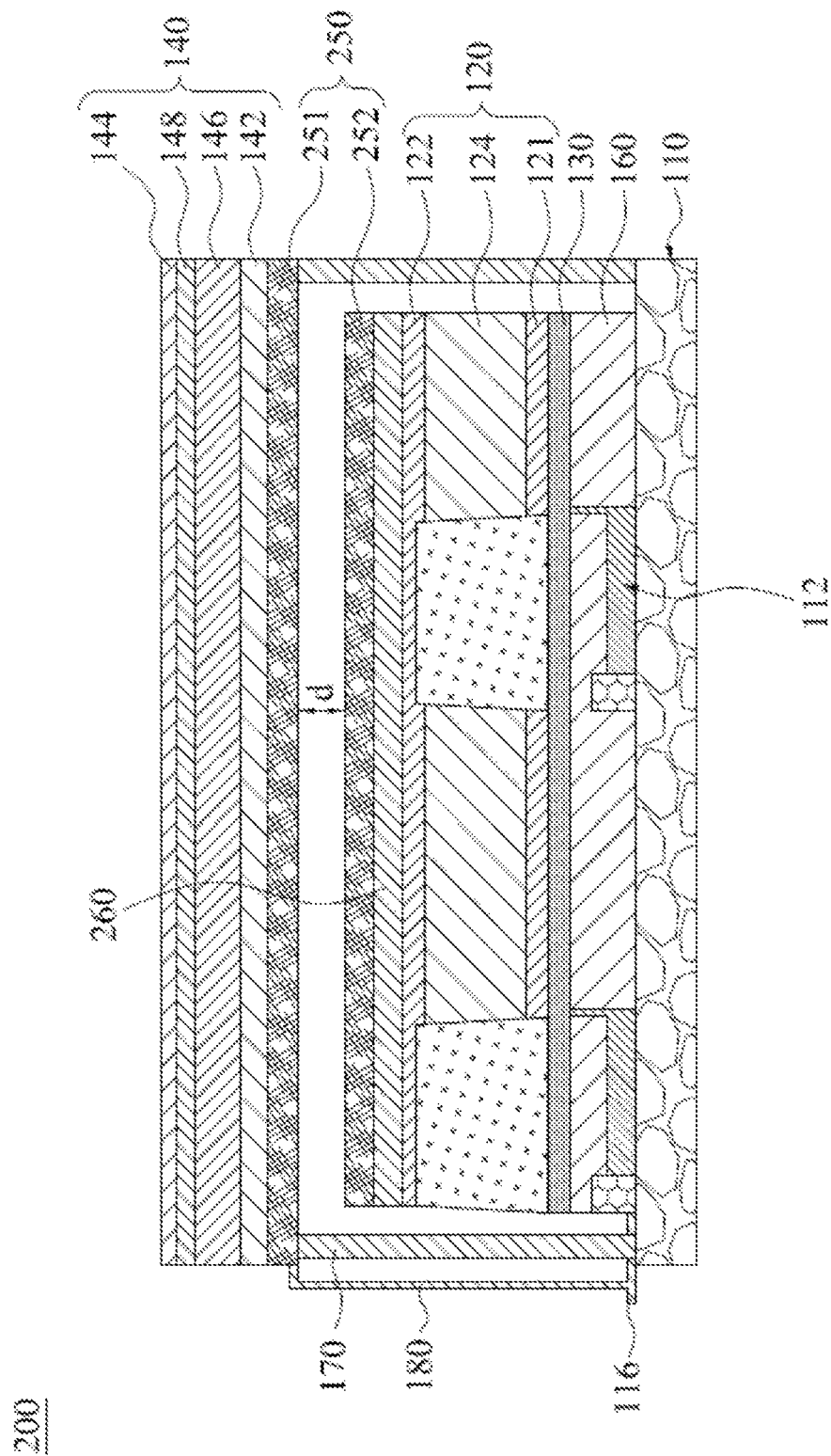
FIG. 9 depicts a cross-sectional schematic diagram of an OLED touch device according to yet another embodiment of this disclosure.

FIG. 9 depicts a cross-sectional schematic diagram of an OLED touch device 200 according to yet another embodiment of this disclosure. One of the features relies on that the touch circuit structure is a double-layered structure, in which one of sensing layers is disposed on an inner side face of the encapsulation plate, whereas the other sensing layer is disposed on a substrate that carries the OLED 120. In greater detail, the OLED touch device 200 includes an active array substrate 110, an OLED 120, a light absorption layer 130, an encapsulation plate 140, and a touch circuit structure 250. The active array substrate 110 includes an active element array 112. The OLED 120 is disposed on the active array substrate 110, and the OLED 120 includes the organic light-emitting layer 124. The light absorption layer 130 may be disposed at any position between the organic light-emitting layer 124 and the active element array 112, for example, disposed according to the previously mentioned embodiments shown in FIG. 1, FIG. 3, and FIG. 4. Hence, as used herein, the meaning of "the light absorption layer is located between the organic light-emitting layer and the active element array" includes the embodiment in which the light absorption layer 130 and the first electrode 121 are integrated into a single-layered structure, as mentioned previously and shown in FIG. 4. In other words, the light absorption layer 130 may be a part or a whole of the first electrode 121. The encapsulation plate 140 is disposed above the OLED 120. The encapsulation plate 140 has the inner side face 140a facing the active array substrate 110. In some embodiments, the encapsulation plate 140 has a refractive index matching layer 142, a glass plate 144, an encapsulation substrate 146, and an adhesive layer 148. As shown in FIG. 9, in some embodiments, the OLED touch device 200 includes the signal line 116, the passivation layer 160, the sealing layer 170, and/or the electrical connection element 180, as mentioned hereinbefore.

Figure 10A:
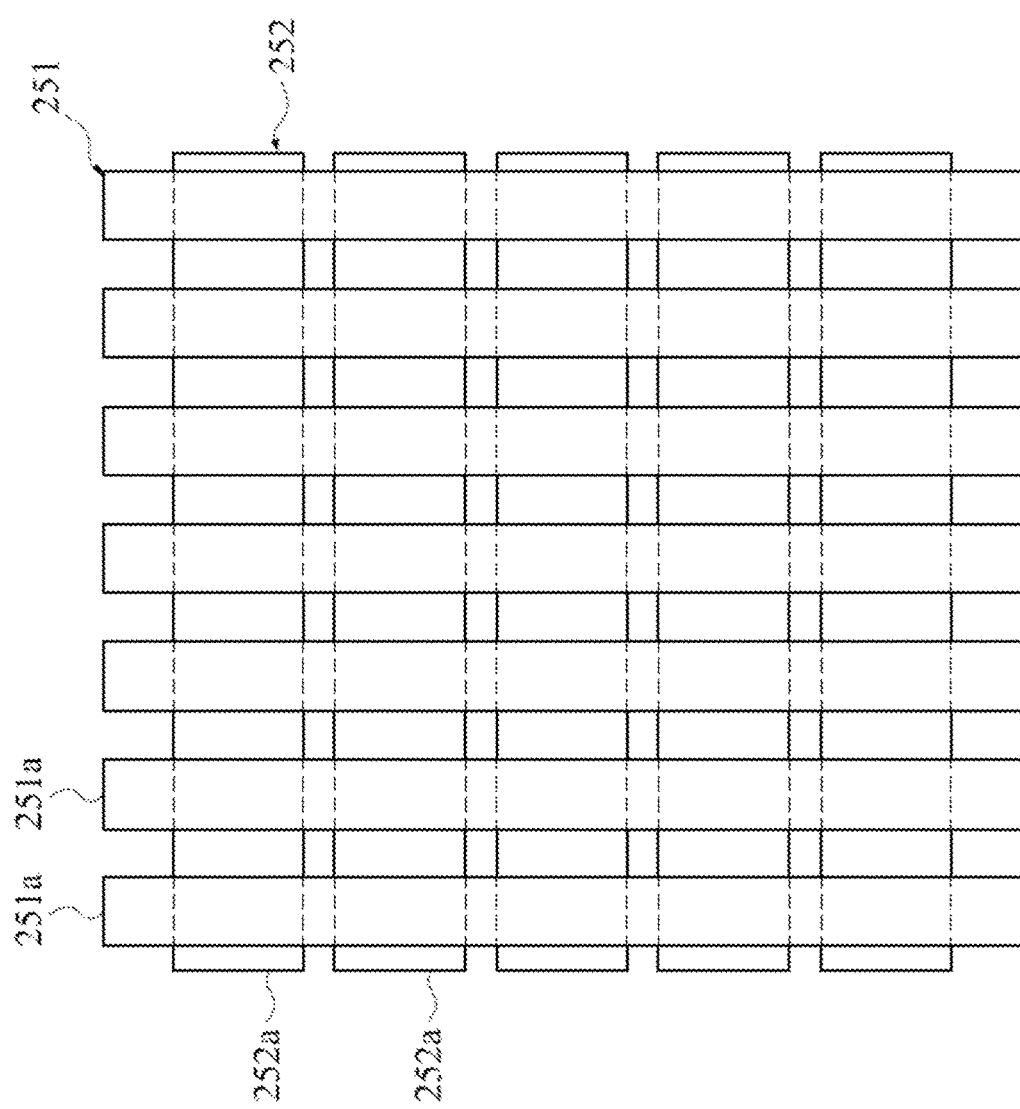
FIG. 10A to FIG. 10C depict top schematic diagrams of first sensing layers and second sensing layers according to various embodiments of this disclosure.
Figure 10B:
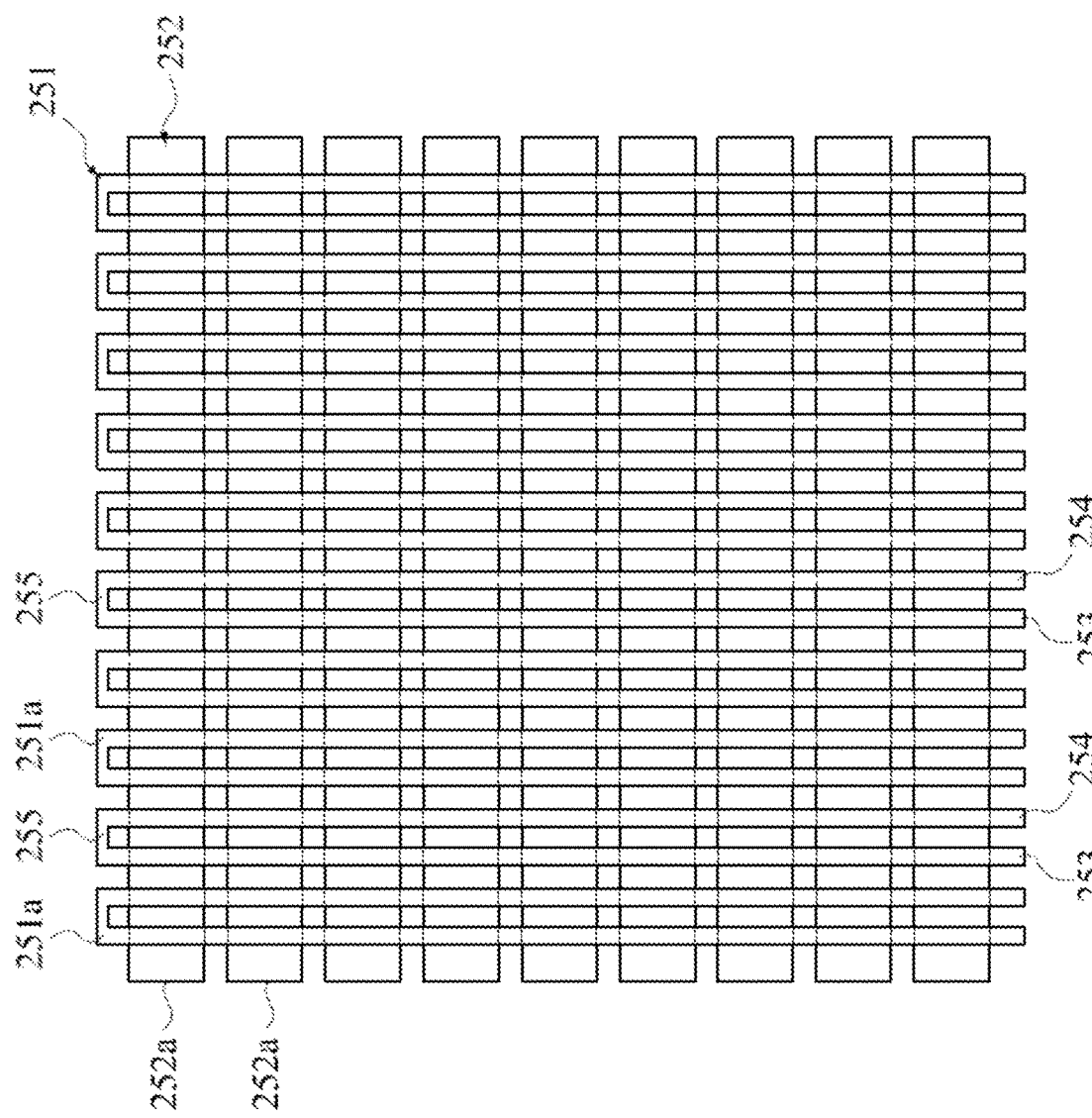
Figure 10C:
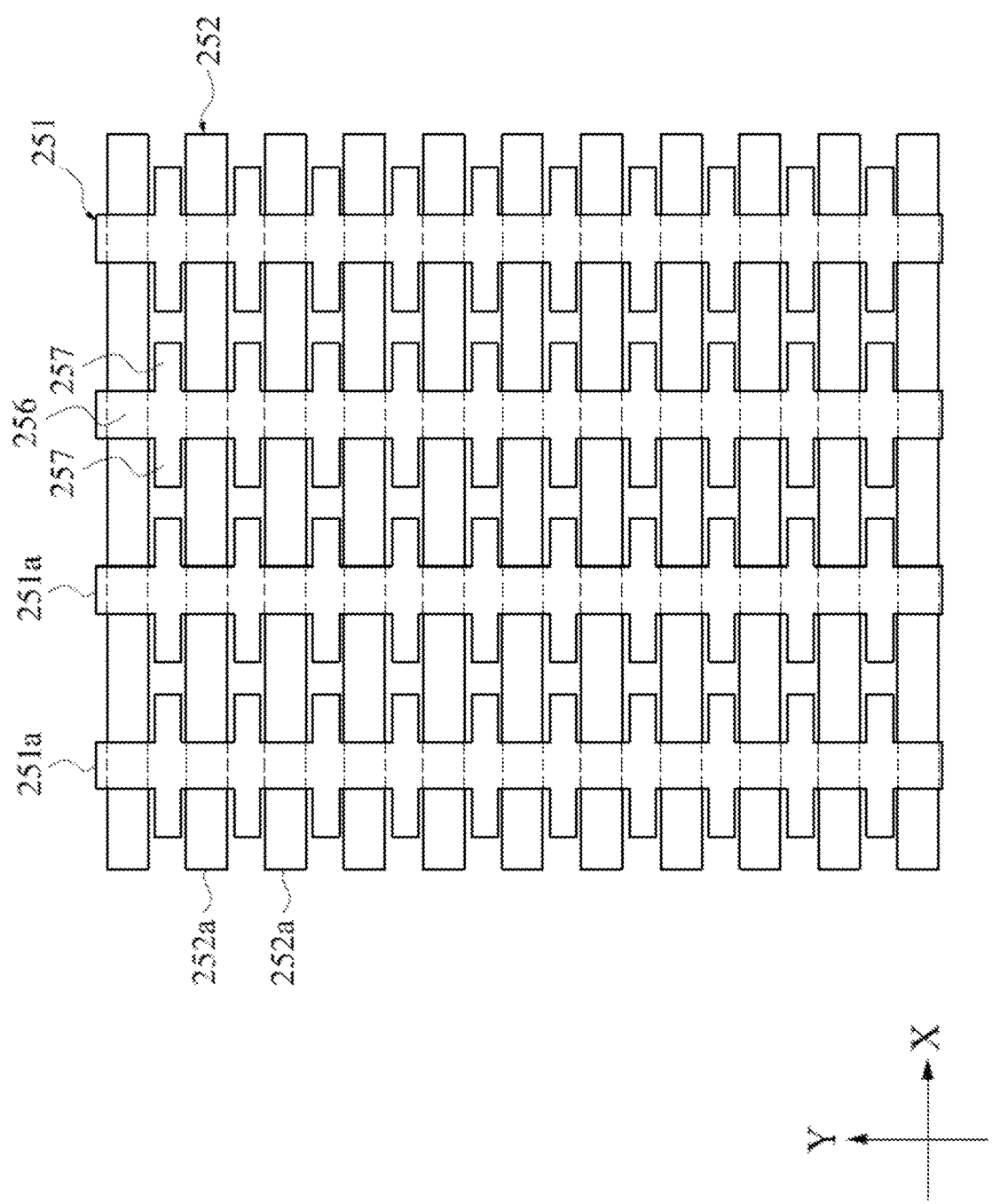

The touch circuit structure 250 includes a first sensing layer 251 and a second sensing layer 252. The first sensing layer 251 is formed on an inner side face 140a of the encapsulation plate 140, and the second sensing layer 252 is located above the OLED 120. In at least one embodiment, the OLED touch device 200 further includes an insulating layer 260 interposed between the second sensing layer 252 and the second electrode 122 of the OLED 120, and the second sensing layer 252 is disposed on the insulating layer 260. In another embodiment, there is a spacing d existing between the first sensing layer 251 and the second sensing layer 252. In other embodiments, an extra dielectric layer (not shown in the figure) may be disposed between the first sensing layer 251 and the second sensing layer 252. The touch circuit structure 250 may include the touch circuit layer 150 described in any embodiment hereinbefore, or the touch circuit structure 250 may be other types in structure. FIG. 10A to FIG. 10C depict top schematic diagrams of the first sensing layers 251 and the second sensing layers 252 according to various embodiments of this disclosure. In FIG. 10A, the first sensing layer 251 includes a plurality of first sensing electrodes 251a extending along Y direction. The second sensing layer 252 includes a plurality of second sensing electrodes 252 along X direction. The first sensing electrodes 251a cross the second sensing electrodes 252a. In FIG. 10B, the first sensing layer 251 includes a plurality of U-shaped first sensing electrodes 251a. Each of the U-shaped first sensing electrodes 251a includes stripped wires 253, 254 and a connecting line 255. The stripped wires 253, 254 extend along Y direction. The connecting line 255 connects end points of the stripped wires 253, 254 to form the U-shaped first sensing electrode 251a. In addition, the second sensing layer 252 includes a plurality of second sensing electrodes 252 extending along X direction. A width of each of the stripped wires 253, 254 is less than a width of the second sensing electrodes 252a. In FIG. 10C, the first sensing layer 251 includes a plurality of ridged first sensing electrodes 251a. Each of the ridged first sensing electrodes 251a includes a body electrode 256 and a plurality of auxiliary electrodes 257. The body electrode 256 extends along Y direction. The auxiliary electrodes 257 extend from the body electrode 256. The second sensing layer 252 includes a plurality of second sensing electrodes 252a extending along X direction. There is spacing existing between two adjacent second sensing electrodes 252a. In at least one embodiment, each of the auxiliary electrodes 257 is aligned with the spacing between the two adjacent second sensing electrodes 252a, and the auxiliary electrodes 257 are symmetrically arranged with respect to the body electrode 256, as shown in FIG. 10C.

Figure 11A:
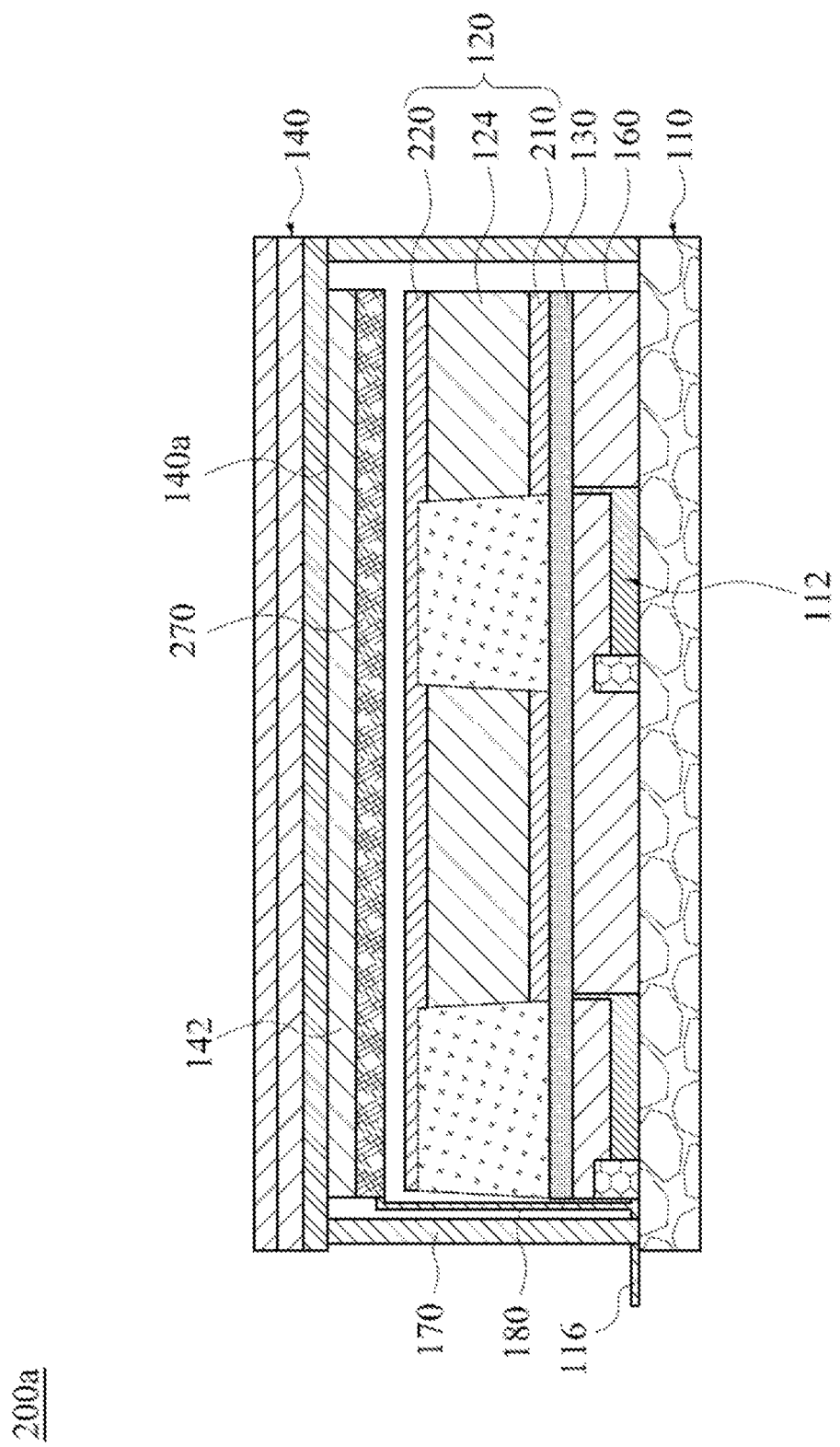
FIG. 11A depicts a cross-sectional schematic diagram of an OLED touch device according to one embodiment of this disclosure.

FIG. 11A depicts a cross-sectional schematic diagram of an OLED touch device 200a according to one embodiment of this disclosure. One of the features relies on a dual function electrode 220 that provides two different functions. In greater detail, the OLED touch device 200a includes an active array substrate 110, at least one OLED 120, a light absorption layer 130, an encapsulation plate 140, and a sensing electrode 270. The active array substrate 110 includes the active element array 112. The OLED 120 is disposed on the active array substrate 110. The OLED 120 includes a first electrode 210, the dual function electrode 220, and an organic light-emitting layer 124. The first electrode 210 is disposed between the organic light-emitting layer 124 and the active element array 112. The dual function electrode 220 is disposed opposite to the first electrode 210, and the first electrode 210 and the dual function electrode 220 are respectively located on opposite sides of the organic light-emitting layer 124. The light absorption layer 130 may be located at any position between the organic light-emitting layer 124 and the active element array 112, for example, disposed according to the previously mentioned embodiments shown in FIG. 1, FIG. 3, and FIG. 4. Hence, as used herein, the meaning of "the light absorption layer is located between the organic light-emitting layer and the active element array" includes the embodiment in which the light absorption layer 130 and the first electrode 121 are integrated into a single-layered structure, as mentioned previously and shown in FIG. 4. In other words, the light absorption layer 130 may be a part or a whole of the first electrode 121. The encapsulation plate 140 is disposed above the OLED 120. The encapsulation plate 140 has an inner side face 140a facing the active array substrate 110. The sensing electrode 270 is formed on the inner side face 140a of the encapsulation plate 140. The dual function electrode 220 and the first electrode 210 respectively constitute an anode and a cathode of the OLED 120, and the dual function electrode 220 and the sensing electrode 270 cooperate together to detect the position of the contact point. That is, the dual function electrode 220 provides two different functions. The dual function electrode 220 and the sensing electrode 270 constitute a touch circuit structure, and the dual function electrode 220 also serves as a drive electrode of the OLED 120.

In some embodiments, the OLED touch device 200a includes the previously mentioned signal line 116, passivation layer 160, sealing layer 170, and/or electrical connection element 180. In addition, the encapsulation plate 140 may include the various layers mentioned previously and shown in FIG. 9.

Figure 11B:
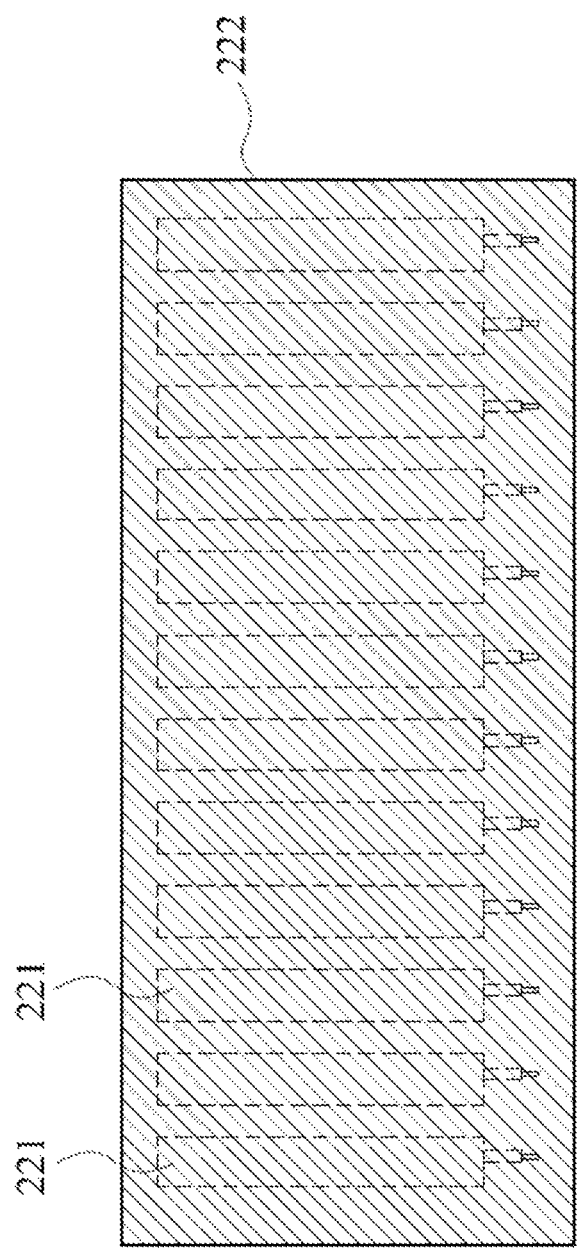
FIG. 11B and FIG. 11C respectively depict top schematic diagrams of a dual function electrode and a sensing electrode according to one embodiment of this disclosure.
Figure 11C:
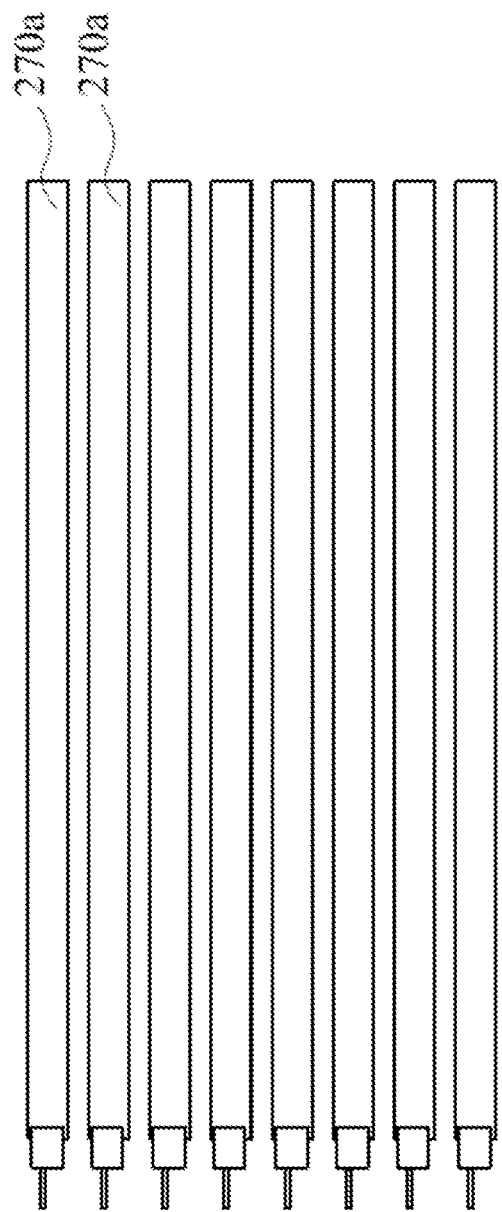

FIG. 11B and FIG. 11C respectively depict top schematic diagrams of the dual function electrode 220 and the sensing electrode 270 according to one embodiment of this disclosure. As shown in FIG. 11B, in at least one embodiment, the dual function electrode 220 includes a plurality of sensing drive electrodes 221 extending along Y direction. The sensing drive electrodes 221 are spaced apart from one another. In another embodiment, the dual function electrode 220 further includes a transparent electrode 222. An area of the transparent electrode 222 covers the sensing drive electrodes 221. Suitable insulating layers (not shown in the figure) are disposed at positions where the transparent electrode 222 overlaps the sensing drive electrodes 221 to avoid an electrical short circuit between the sensing drive electrodes 221 and the transparent electrode 222. Then, as shown in FIG. 11C, the sensing electrode 270 includes a plurality of detecting electrodes 270a extending along X direction. The detecting electrodes 270a are spaced apart from one another. Additionally, the detecting electrodes 270a and the sensing drive electrodes 221 cross each other in the top plane view.

Figure 12:
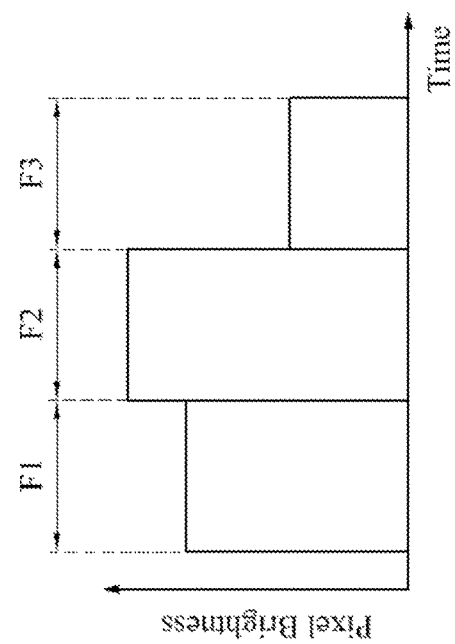
FIG. 12 depicts a schematic diagram of a drive method for an OLED display according to the prior art.

In the embodiment depicted in FIG. 11A, since the dual function electrode 220 is one of drive electrodes of the OLED 120 and is also a part of a touch circuit structure, a new drive method is necessary to allow the OLED 120 and the touch circuit structure to cooperate in harmony. FIG. 12 depicts a schematic diagram of a drive method for an OLED display according to the prior art. According to the prior art drive method, in a single display picture F1 (frame), each pixel of the OLED display is maintained at a fixed light emitting state until a next display picture F2 (next frame), in which the each pixel of the OLED display is updated to another light emitting state because a drive signal is changed. In other words, during the time when each of the display pictures F1, F2 and a display picture F3 is displayed, the each pixel of the OLED display basically maintains the same light emitting state except for the zero gray scale, as shown in FIG. 12.

Figure 13:
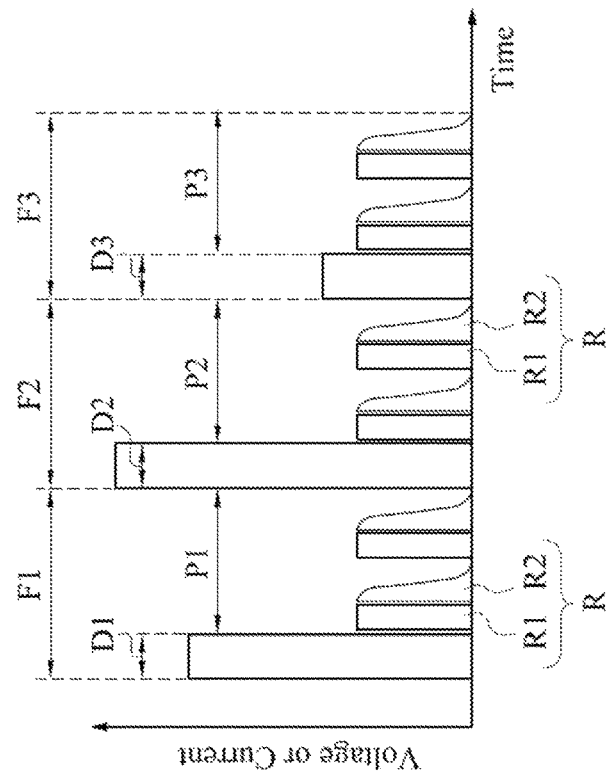
FIG. 13 depicts a schematic diagram of a drive method for an OLED touch device according to one embodiment of this disclosure.

FIG. 13 depicts a schematic diagram of a drive method for the OLED touch device 200a according to one embodiment of this disclosure. Since the dual function electrode 220 of the OLED touch device 200a needs to provide two different functions, the present disclosure proposes a "time division multiplexing drive method". In greater detail, the original time period of each of the frames F1, F2, F3 is divided into at least a first time interval and a second time interval. The first time interval is used for driving the OLED to emit light. The second time interval is used for detecting the positions of the contact points. For example, the time period of the frame F1 is divided into a first time interval D1 and a second time interval P1, the time period of the frame F2 is divided into a first time interval D2 and a second time interval P2, the time period of the frame F3 is divided into a first time interval D3 and a second time interval P3. The first time intervals D1, D2, and D3 are sequentially used for driving the OLED to emit light in the frames F1, F2, F3 so as to provide an OLED panel with the function of displaying images. The second time intervals P1, P2, P3 are used for detecting coordinates of the contact points. Hence, during the first time intervals D1, D2, D3, the dual function electrode 220 and the first electrode 210 cooperate together to drive the OLED to emit light. During the second time intervals P1, P2, P3, the dual function electrode 220 and the sensing electrode 270 cooperate together to provide the function of detecting the positions of the contact points. In the second time intervals P1, P2, P3, a single set or a plurality of sets of touch signals R may be added. Each set of the touch signals R includes a charging signal R1 and a sensing signal R2. The charging signal R1 is used to charge a touch capacitor. The sensing signal R2 is used to detect a capacitance value of the capacitor so as to determine the position of the contact point. The drive method disclosed herein can be applicable to the OLED touch device 200a so that the dual function electrode 220 is single-layered in structure, and can provide two different functions. In addition to that, the frames are changed from the original "hold type display" to the "pulse-liked type display", which is helpful in improving the dynamic picture quality and service lifetime of the OLED display.

Figure 14:
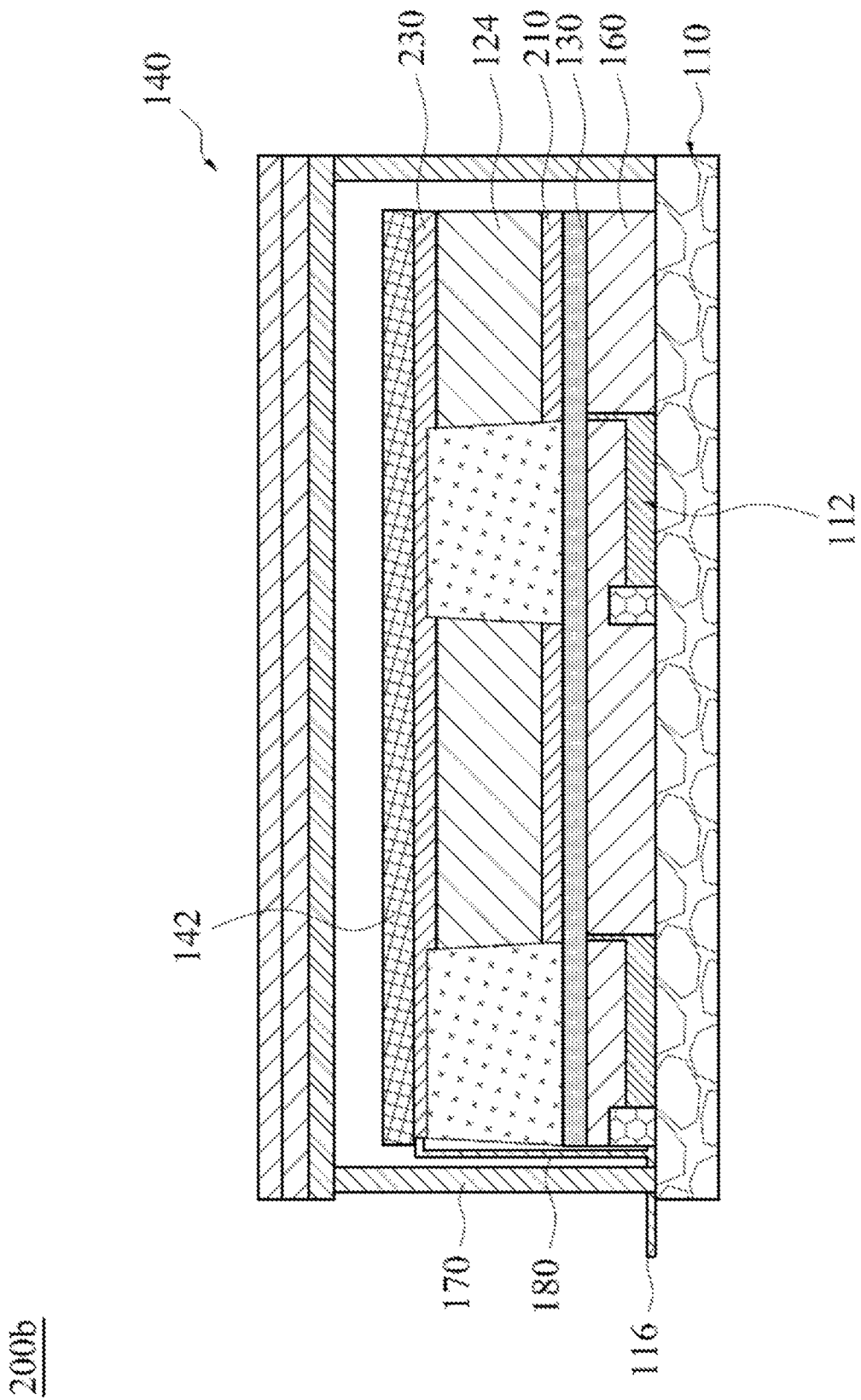
FIG. 14 depicts a cross-sectional schematic diagram of an OLED touch device according to another embodiment of this disclosure.

FIG. 14 depicts a cross-sectional schematic diagram of an OLED touch device 200b according to another embodiment of this disclosure. One of the features is that a dual functional sensing layer 230 has both functions of driving the organic light-emitting layer 124 to emit light and detecting the position of the contact point. In greater detail, the OLED touch device 200b includes an active array substrate 110, a first electrode 210, a light absorption layer 130, an organic light-emitting layer 124, and the dual functional sensing layer 230. The active array substrate 110 includes an active element array 112. The first electrode 210 is disposed above the active element array 112. The organic light-emitting layer 124 is disposed on the first electrode 210. The dual functional sensing layer 230 is located on the organic light-emitting layer 124 for detecting a position of a contact point and driving the organic light-emitting layer 124 to emit light. During a first time interval, the dual functional sensing layer 230 and the first electrode 210 drive the organic light-emitting layer 124 to emit light. During a second time interval, the dual functional sensing layer 230 detects the position of the contact point. The detailed drive method is the same as the above "time division multiplexing drive method" shown in FIG. 13. The light absorption layer 130 may be located in any layer between the organic light-emitting layer 124 and the active element array 112, for example, disposed according to the previously mentioned embodiments shown in FIG. 1, FIG. 3, and FIG. 4. Hence, as used herein, the meaning of "the light absorption layer is located between the organic light-emitting layer and the active element array" includes the embodiment in which the light absorption layer 130 and the first electrode 121 are integrated into a single-layered structure, as mentioned previously and shown in FIG. 4. In other words, the light absorption layer 130 may be a part or a whole of the first electrode 121. In some embodiments, the dual functional sensing layer 230 includes the "capacitive sensing circuits in the bridge structures" mentioned previously and shown in FIG. 5a, FIG. 5B, FIG. 6A and FIG. 6B. In some other embodiments, the dual functional sensing layer 230 includes the "single-layered capacitive sensing circuits" mentioned previously and shown in FIG. 7 and FIG. 8. For example, the dual functional sensing layer 230 includes the wedge-shaped sensing electrodes shown in FIG. 7. Theses wedge-shaped sensing electrodes extend on the same plane and do not overlap one another. In some other embodiments, the dual functional sensing layer 230 includes a plurality of sending electrodes and a plurality of receiving electrodes, as mentioned previously and shown in FIG. 8. The sending electrodes and the receiving electrodes extend on a same plane, and the sending electrodes and the receiving electrodes do not overlap each other. In other embodiments, the OLED touch device 200b includes the previously mentioned signal line 116, encapsulation plate 140, refractive index matching layer 142, passivation layer 160, sealing layer 170, and/or electrical connection element 180.

Figure 15:
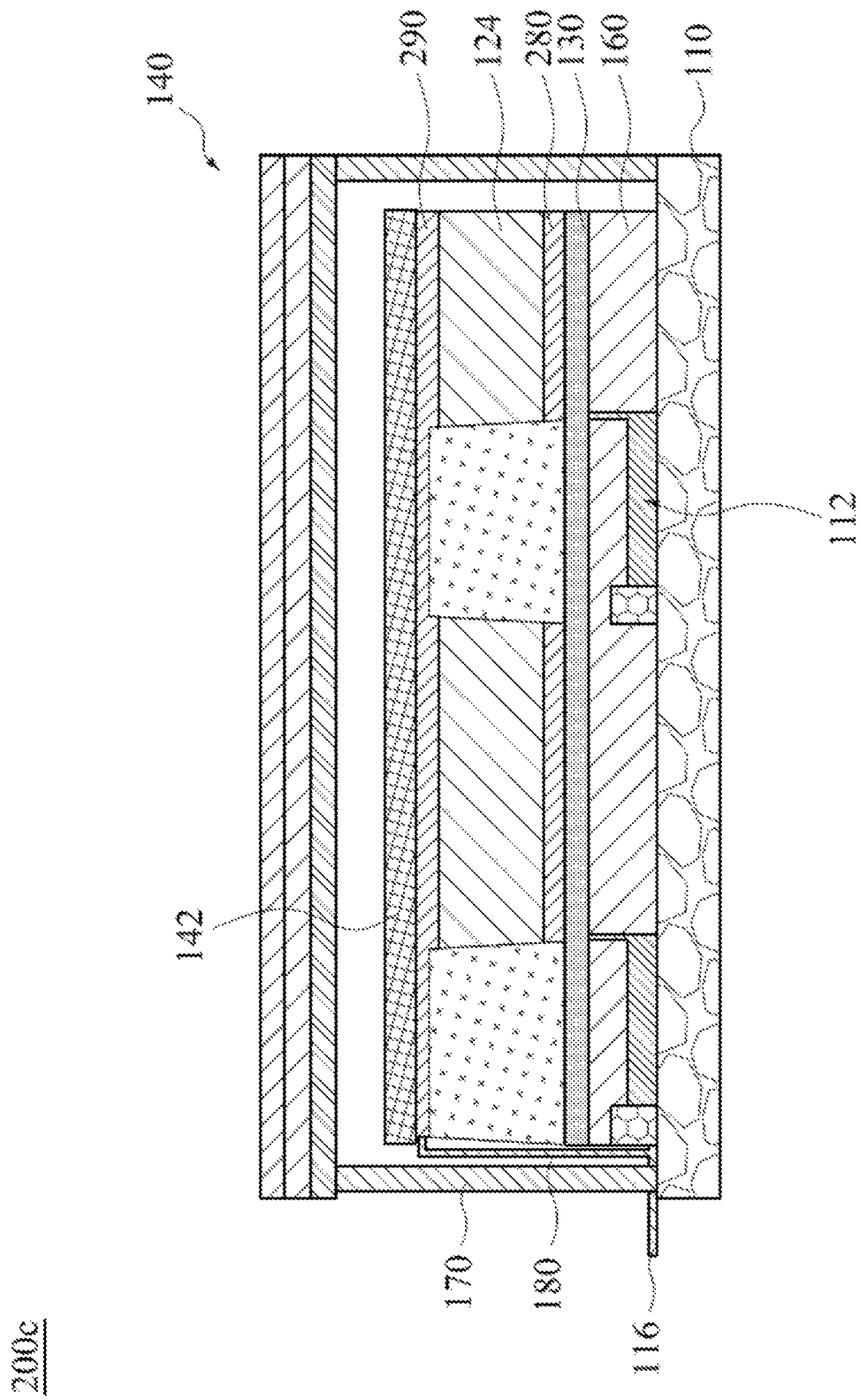
FIG. 15 depicts a cross-sectional schematic diagram of an OLED touch device according to still another embodiment of this disclosure.

FIG. 15 depicts a cross-sectional schematic diagram of an OLED touch device 200c according to still another embodiment of this disclosure. One of the features is that two electrodes that drive the organic light-emitting layer to emit light are the two electrodes used for detecting the position of the contact point. In greater detail, the OLED touch device 200c includes an active array substrate 110, a first dual function electrode 280, an organic light-emitting layer 124, a light absorption layer 130, and a second dual function electrode 290. The active array substrate 110 includes an active element array 112. The first dual function electrode 280 is disposed above the active element array 112. The organic light-emitting layer 124 is disposed on the first dual function electrode 280. The second dual function electrode 290 is located on the organic light-emitting layer 124. The first dual function electrode 280 and the second dual function electrode 290 are used for detecting a position of a contact point and driving the organic light-emitting layer 124 to emit light. During a first time interval, the first dual function electrode 280 and the second dual function electrode 290 drive the organic light-emitting layer 124 to emit light. During a second time interval, the first dual function electrode 280 and the second dual function electrode 290 detects the position of the contact point. The detailed drive method is the same as the above "time division multiplexing drive method" shown in FIG. 13. Top patterns of the first dual function electrode 280 and the second dual function electrode 290 may be, for example, patterns of the previously mentioned first sensing layer 251 and second sensing layer 152, as shown in FIG. 10A to FIG. 10C. Or, the top patterns of the first dual function electrode 280 and the second dual function electrode 290 may be, for example, patterns of the dual function electrode 220 and the sensing electrode 270, as mentioned previously and shown in FIG. 11B to FIG. 11C. The light absorption layer 130 may be located in any layer between the organic light-emitting layer 124 and the active element array 112, for example, disposed according to the previously mentioned embodiments shown in FIG. 1, FIG. 3, and FIG. 4. Hence, as used herein, the meaning of "the light absorption layer is located between the organic light-emitting layer and the active element array" includes the embodiment in which the light absorption layer 130 and the first electrode 121 are integrated into a single-layered structure, as mentioned previously and shown in FIG. 4. In other words, the light absorption layer 130 may be one part or a whole of the first electrode 121. In some embodiments, the OLED touch device 200c includes the previously mentioned signal line 116, encapsulation plate 140, refractive index matching layer 142, passivation layer 160, sealing layer 170, and/or electrical connection element 180.

Figure 16:
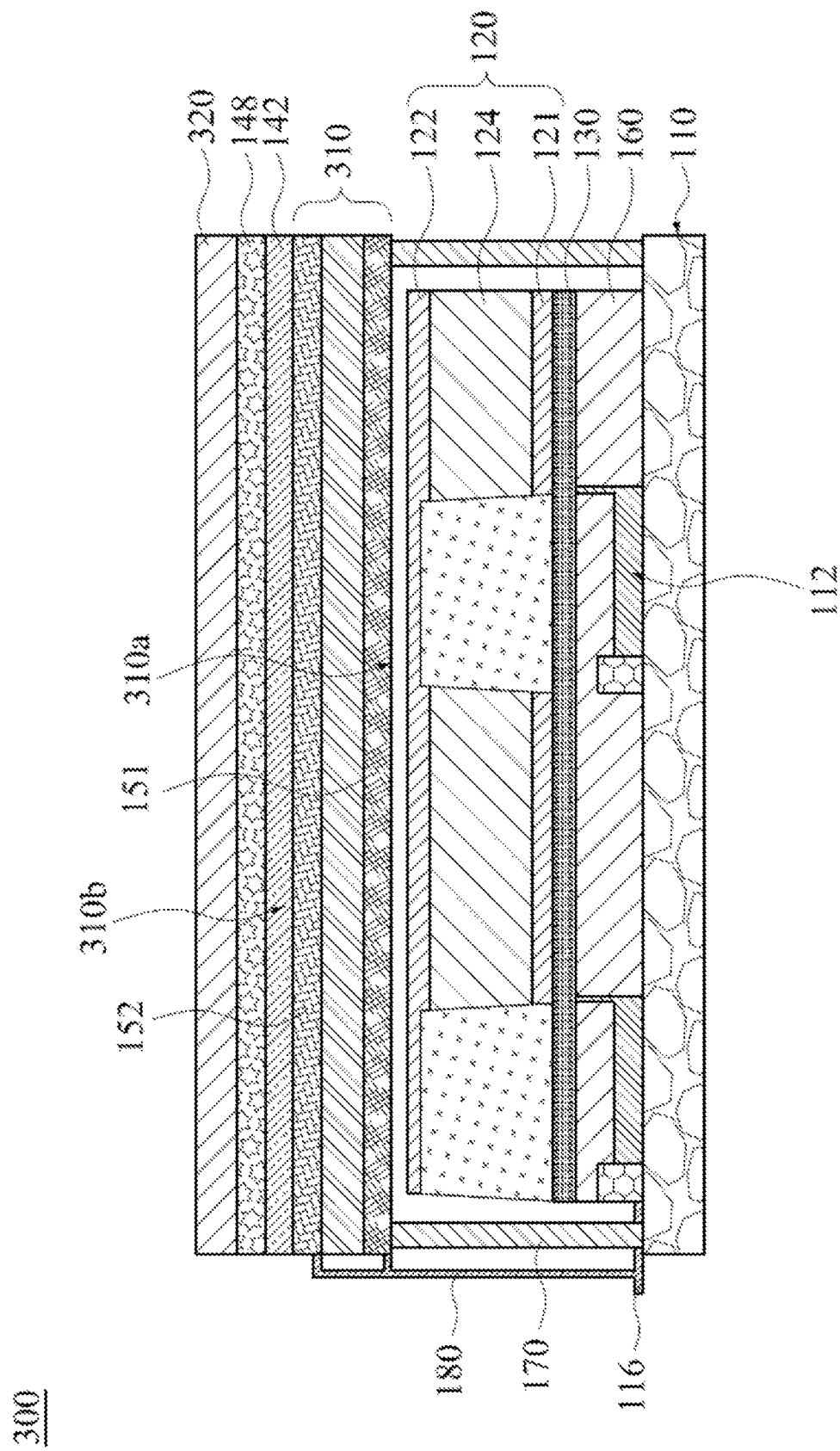
FIG. 16 depicts a cross-sectional schematic diagram of an OLED touch device according to yet another embodiment of this disclosure.

FIG. 16 depicts a cross-sectional schematic diagram of an OLED touch device 300 according to yet another embodiment of this disclosure. One of the features is that the first sensing electrode 151 is located on an inner side of an encapsulation sensing plate 310, and the second sensing electrode 152 is located on an outer side of the encapsulation sensing plate 310. In greater detail, the OLED touch device 300 includes an active array substrate 110, at least one OLED 120, and an encapsulation sensing plate 310. The active array substrate 110 includes an active element array 112. The OLED 120 is disposed on the active array substrate 110. The OLED 120 includes a first electrode 121, a second electrode 122, and an organic light-emitting layer 124. The first electrode 121 is disposed on the one side adjacent to the active element array 112. The second electrode 122 is disposed opposite to the first electrode 121. The average transmittance of the first electrode 121 and the second electrode 122 in the wavelength range of visible light is greater than approximately 0.6. The organic light-emitting layer 124 is interposed between the first electrode 121 and the second electrode 122. The encapsulation sensing plate 310 is disposed over the second electrode 122. The encapsulation sensing plate 310 has an inner side 310a an outer side 310b opposite to each other. The inner side 310a is located on one side adjacent to the second electrode 122. The encapsulation sensing plate 310 includes the first sensing electrode 151 and the second sensing electrode 152. The first sensing electrode 151 is located on the inner side 310a of the encapsulation sensing plate 310, and the second sensing electrode 152 is located on the outer side 310b of the encapsulation sensing plate 310. Top patterns of the first sensing electrode 151 and the second sensing electrode 152 may be, for example, patterns of the previously mentioned first sensing layer 251 and second sensing layer 152, as shown in FIG. 10A to FIG. 10C. Or, the top patterns of the first sensing electrode 151 and the second sensing electrode 152 may be, for example, patterns of the dual function electrode 220 and the sensing electrode 270, as mentioned previously and shown in FIG. 11B to FIG. 11C. In some embodiments, the OLED touch device 300 includes a protective plate 320 covering the second sensing electrode 152. In greater detail, the protective plate 320 can be bonded to and cover the second sensing electrode 152 located on the encapsulation sensing plate 310 through an adhesion layer 148. In some other embodiments, the OLED touch device 300 includes the previously mentioned signal line 116, light absorption layer 130, refractive index matching layer 142, passivation layer 160, sealing layer 170, and/or electrical connection element 180. In some embodiments, the light absorption layer 130 may be located in any layer between the organic light-emitting layer 124 and the active element array 112, for example, disposed according to the previously mentioned embodiments shown in FIG. 1, FIG. 3, and FIG. 4. Hence, as used herein, the meaning of "the light absorption layer is located between the organic light-emitting layer and the active element array" includes the embodiment in which the light absorption layer 130 and the first electrode 121 are integrated into a single-layered structure, as mentioned previously and shown in FIG. 4. In other words, the light absorption layer 130 may be one part or a whole of the first electrode 121.

Figure 17:
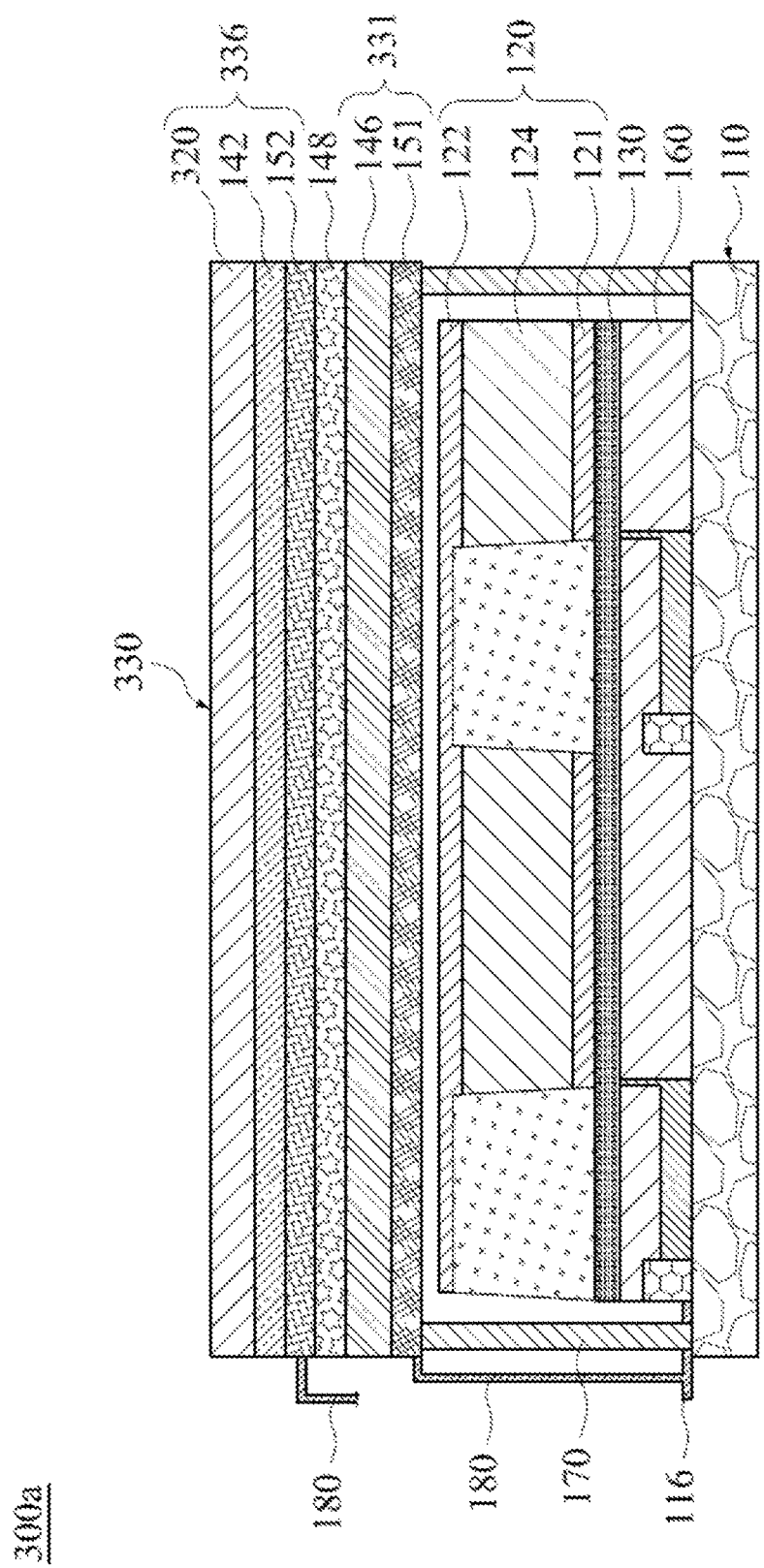
FIG. 17 depicts a cross-sectional schematic diagram of an OLED touch device according to one embodiment of this disclosure.

FIG. 17 depicts a cross-sectional schematic diagram of an OLED touch device 300a according to one embodiment of this disclosure. The OLED touch device 300a has a structure similar to the OLED touch device 300 shown in FIG. 16, and a difference there between is that the encapsulation sensing plates are slightly different from each other. The encapsulation sensing plate 330 includes a first substrate 331, a second substrate 336, and an adhesion layer 148. The first substrate 331 includes a first sensing electrode 151 and an encapsulation substrate 146. The second substrate 336 includes a second sensing electrode 152 and a protective plate 320. In greater detail, the first sensing electrode 151 is first formed on the encapsulation substrate 146. In addition, the second sensing electrode 152 is formed on the protective plate 320. The refractive index matching layer 142 may be optionally formed between the second sensing electrode 152 and the protective plate 320. Then, the first substrate 331 and the second substrate 336 are bonded through the adhesion layer 148 to form the encapsulation sensing plate 330. After that, the active array substrate 110 having the OLED 120 formed thereon and the encapsulation sensing plate 330 are encapsulated to obtain the OLED touch device 300a. It is noted that the first substrate 331 and the second substrate 336 are separately fabricated, and the first sensing electrode 151 and the second sensing electrode 152 are respectively disposed on two opposite sides of the encapsulation substrate 146. In this manner, there is no necessity to form a dielectric layer or an insulating layer between the first sensing electrode 151 and the second sensing electrode 152. Top patterns and other structural features of the first sensing electrode 151 and the second sensing electrode 152 may be, for example, patterns and structural features of the previously mentioned first sensing layer 251 and second sensing layer 152, as shown in FIG. 10A to FIG. 10C. Or, the top patterns and other structural features of the first sensing electrode 151 and the second sensing electrode 152 may be, for example, patterns and structural features of the dual function electrode 220 and the sensing electrode 270, as mentioned previously and shown in FIG. 11B to FIG. 11C. The active array substrate 110 and the OLED 120 of the OLED touch device 300a may be the same as those previously described in any of the embodiments.

Figure 18:
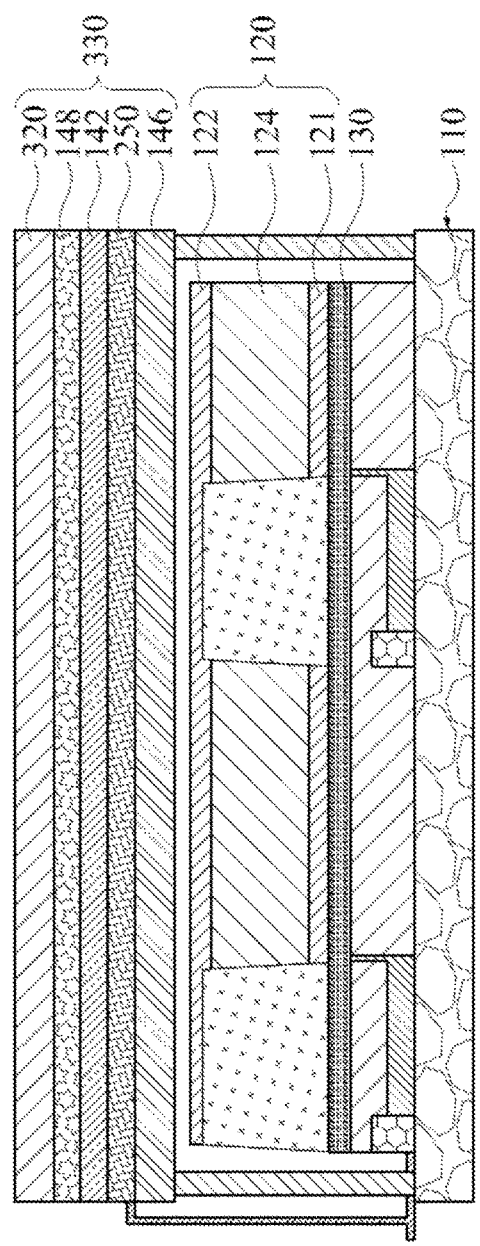
FIG. 18 depicts a cross-sectional schematic diagram of an OLED touch device according to another embodiment of this disclosure.

FIG. 18 depicts a cross-sectional schematic diagram of an OLED touch device 300b according to another embodiment of this disclosure. The OLED touch device 300b has a structure similar to the OLED touch device 300a shown in FIG. 17, and a difference there between is that the encapsulation sensing plates are slightly different from each other. In greater detail, the encapsulation sensing plate 330 is disposed over the second electrode 122 of the OLED 120, and the encapsulation sensing plate 330 includes an encapsulation substrate 146 and a touch circuit structure 250. In some embodiments, the encapsulation sensing plate 330 further includes the refractive index matching layer 142 to cover the touch circuit structure 250. In other embodiments, the OLED touch device 300b further includes the protective plate 320 and the adhesion layer 148. The protective plate 320 covers the touch circuit structure 250. The light absorption layer 130 may be disposed in any layer between the organic light-emitting layer 124 and the active element array 112, for example, disposed according to the previously mentioned embodiments shown in FIG. 1, FIG. 3, and FIG. 4. Hence, as used herein, the meaning of "the light absorption layer is located between the organic light-emitting layer and the active element array" includes the embodiment in which the light absorption layer 130 and the first electrode 121 are integrated into a single-layered structure, as mentioned previously and shown in FIG. 4. In other words, the light absorption layer 130 may be one part or a whole of the first electrode 121. In at least one embodiment, the touch circuit structure 250 includes the "capacitive sensing circuits in the bridge structures" mentioned previously and shown in FIG. 5a, FIG. 5B, FIG. 6A and FIG. 6B. In another embodiment, the touch circuit structure 250 includes the "single-layered capacitive sensing circuits" mentioned previously and shown in FIG. 7 and FIG. 8. In still another embodiment, the touch circuit structure 250 includes the previously mentioned first sensing layer 251 and second sensing layer 252 shown in FIG. 10A-FIG. 10C. The active array substrate 110 and the OLED 120 of the OLED touch device 300b may be the same as those previously described in any of the embodiments.

Figure 19:
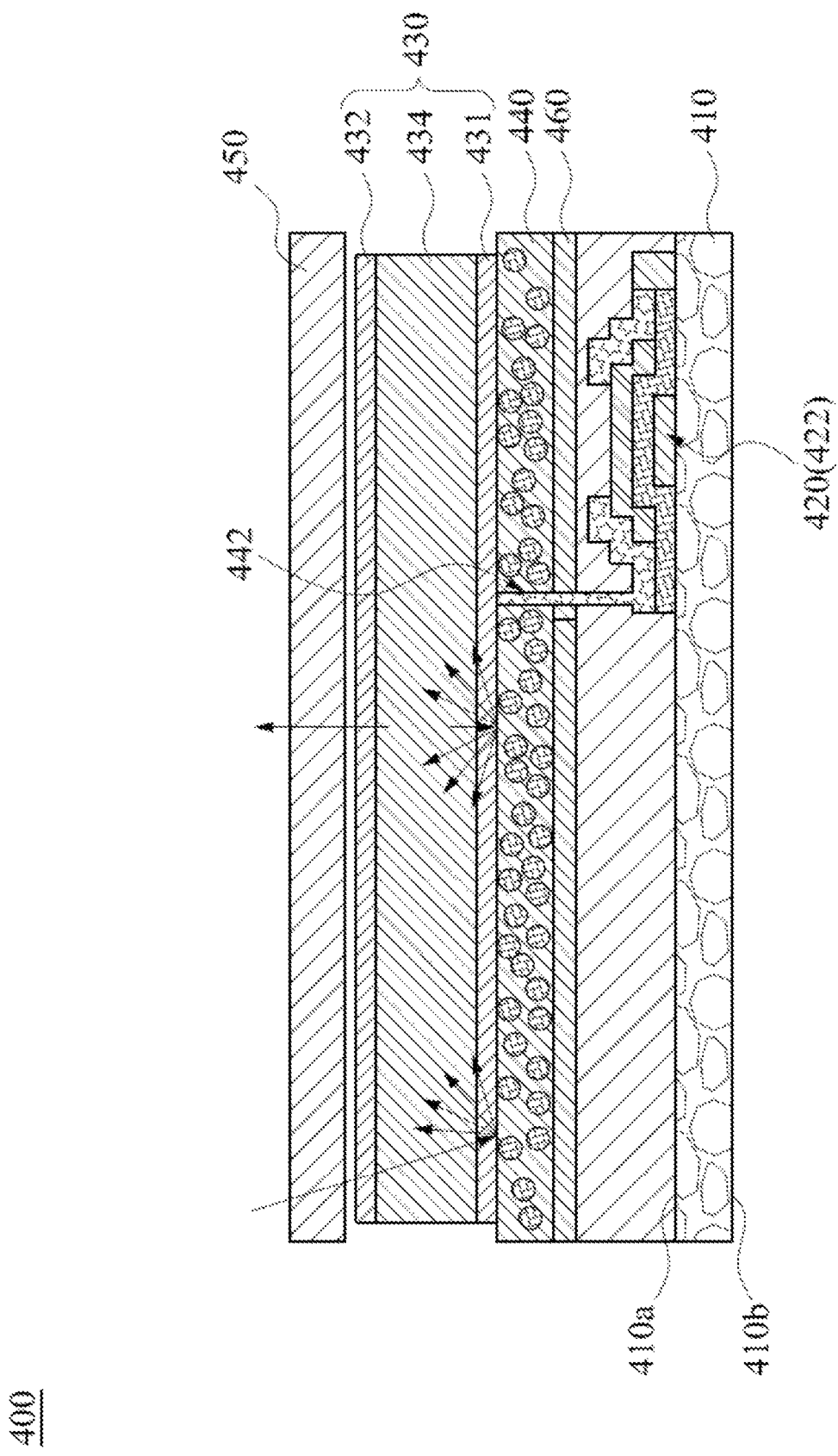
FIG. 19 to FIG. 22 depict cross-sectional schematic diagrams of OLED display devices according to various embodiments of this disclosure.

FIG. 19 to FIG. 22 depict cross-sectional schematic diagrams of OLED display devices 400 according to various embodiments of this disclosure. One of the features relies on that the OLED display device 400 include an optical scattering layer 440. With reference to FIG. 19, the OLED display device 400 includes a substrate 410, an active element array 420, at east one OLED 430, the optical scattering layer 440, and an encapsulation plate 450. The substrate 410 has an upper surface 410a and a lower surface 410b opposite to each other. The active element array 420 is disposed on the upper surface 410a of the substrate 410. The active element array 420 includes a plurality of active elements 422. The OLED 430 is disposed above the active element array 420. The OLED 430 includes a first electrode 431, a second electrode 432, and an organic light-emitting layer 434. The first electrode 431 is disposed on one side adjacent to the active element array 420. The second electrode 432 is disposed opposite to the first electrode 431. The organic light-emitting layer 434 is interposed between the first electrode 431 and the second electrode 432. The encapsulation plate 450 is disposed over the second electrode 432 of the OLED 430. In at least one embodiment, the optical scattering layer 440 is disposed between the active element array 420 and the first electrode 431, as shown in FIG. 19. In one example, the optical scattering layer 440 has a via hole 442 to allow the active element array 420 and the first electrode 431 to be electrically connected with each other through a conductive material filled in the via hole 442. The conductive material filled in the via hole 442 may be, for example, the same material as that of the active element array 420 or the first electrode 431 and formed in a same process.

In some embodiments, the optical scattering layer 440 is formed by adding diffusion pigment to a film substrate. The optical scattering layer 440 utilizes difference(s) in refractive index and interface shapes of the diffusion pigment to deflect the optical path of the incident light. The optical scattering layer 440 will disperse the incident light, which includes "transmission scattering" and "reflection scattering". The light diffusion pigment may include, for example, silicon dioxide, titanium dioxide, polystyrene, or composite particles thereof. In addition, in some embodiments, the diffusion pigment is made of a colored scattering material to compensate for a specific color, or absorb or block light in a specific waveband.

As mentioned previously, two drive electrodes 431, 432 of the OLED 430 are made of a conductive material having a high transmittance and a low reflectance. Electrodes having this optical property provide a high transmittance to the light self-illuminated from the OLED in the light-emitting direction. As for light incident from the outside, the reflecting effect can be reduced because of the low reflectance. Building the additional optical scattering layer 440 above the active element substrate 110 can diffuse and reflect a part of the light self-illuminated from the OLED 430 towards the emergent surface to increase the light extraction efficiency. The light incident from the outside passing through the electrode material with the high transmittance and the low reflectance is diffused after reaching the optical scattering layer 440 to blur and homogenize the incident light that originally has a strong directivity. As a result, the strong reflection that originally would occur can be reduced to increase the brightness contrast of the display having the OLED 430.

In at least one embodiment, the OLED display device 400 may further include a patterned light shielding layer 460. The patterned light shielding layer 460 is located above each of the active elements 422 to avoid a leakage current generated by the active element 422 because of the light emitted from the OLED or the light incident from the environment.

Figure 20:
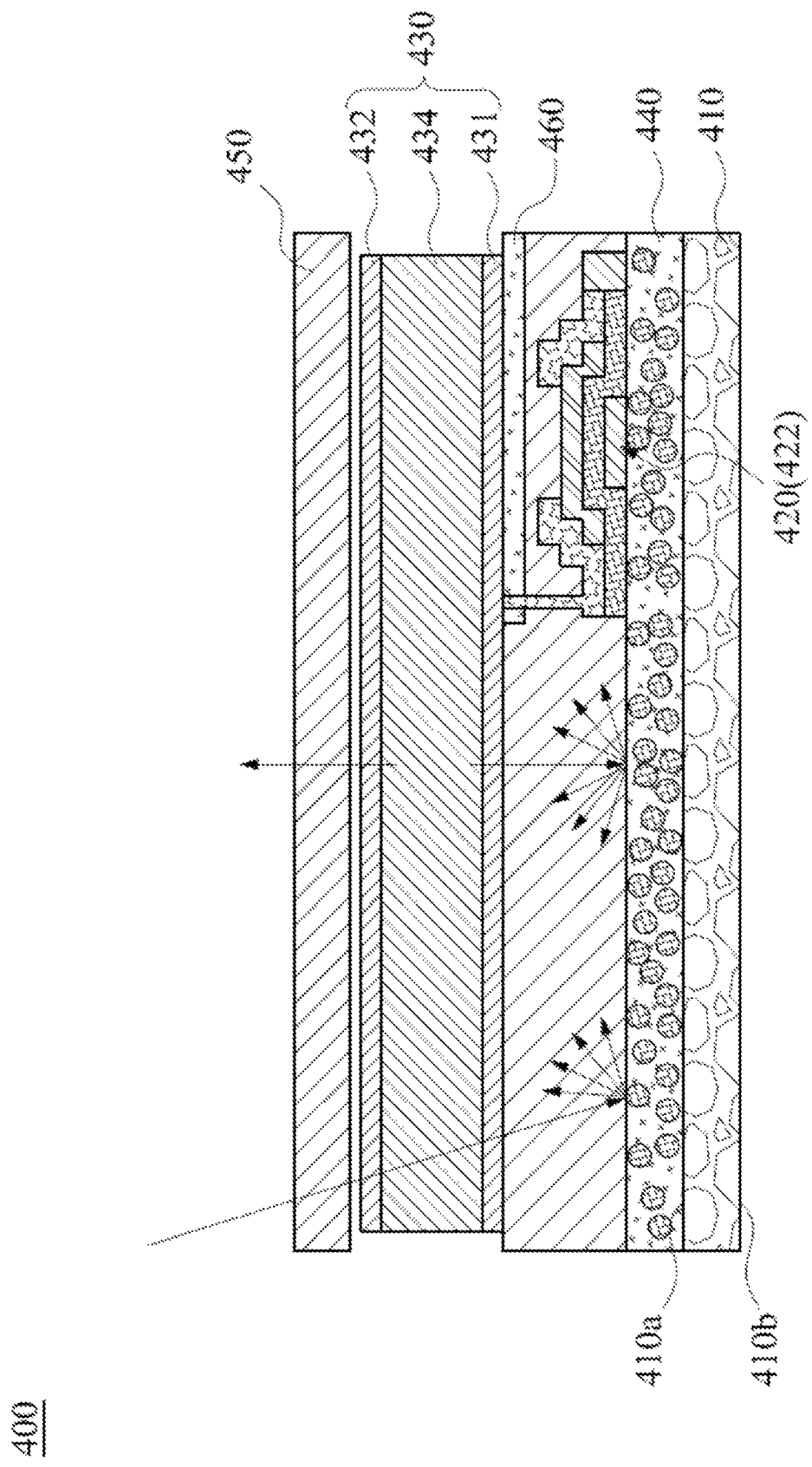
Figure 21:
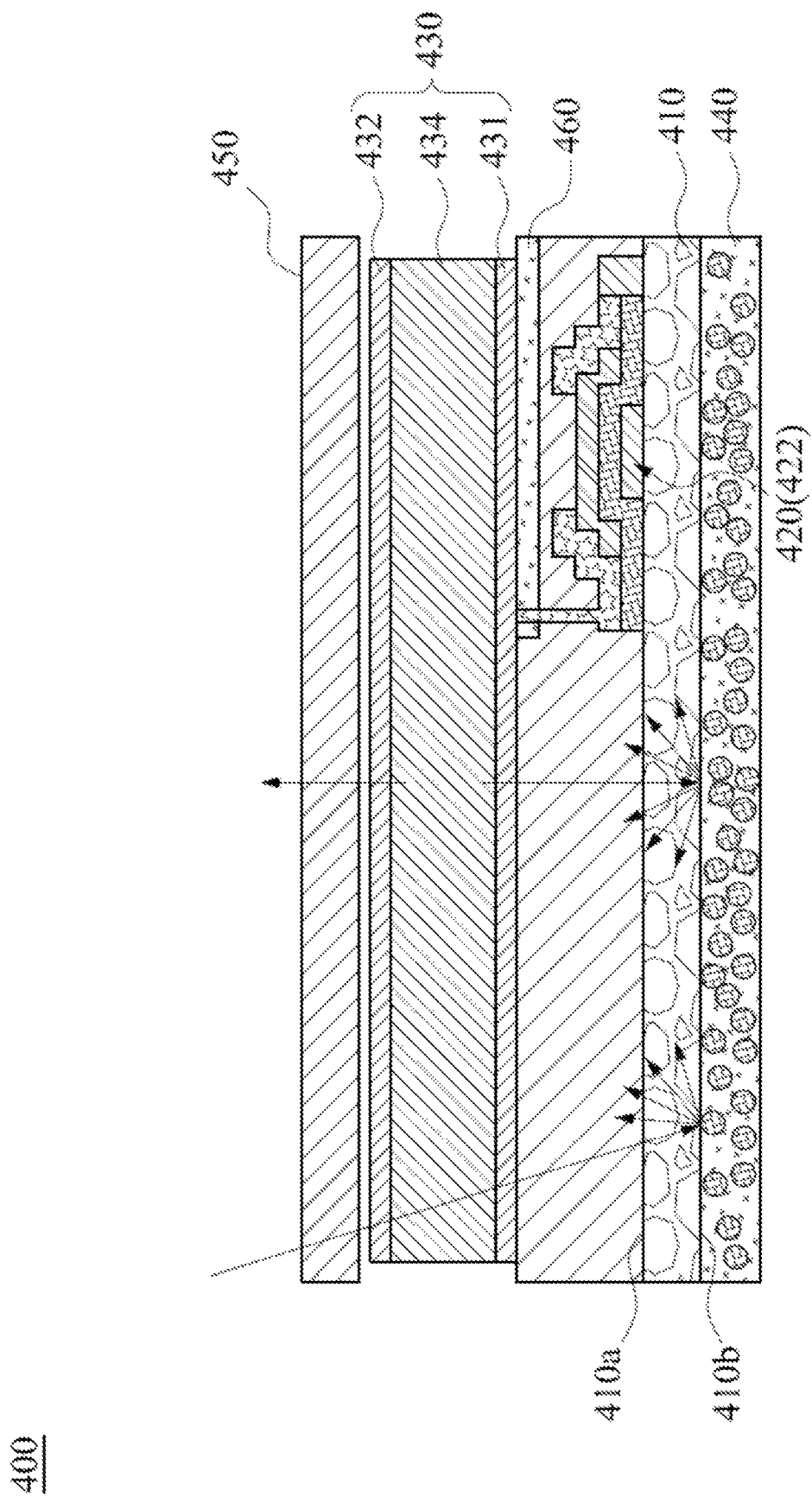
Figure 22:
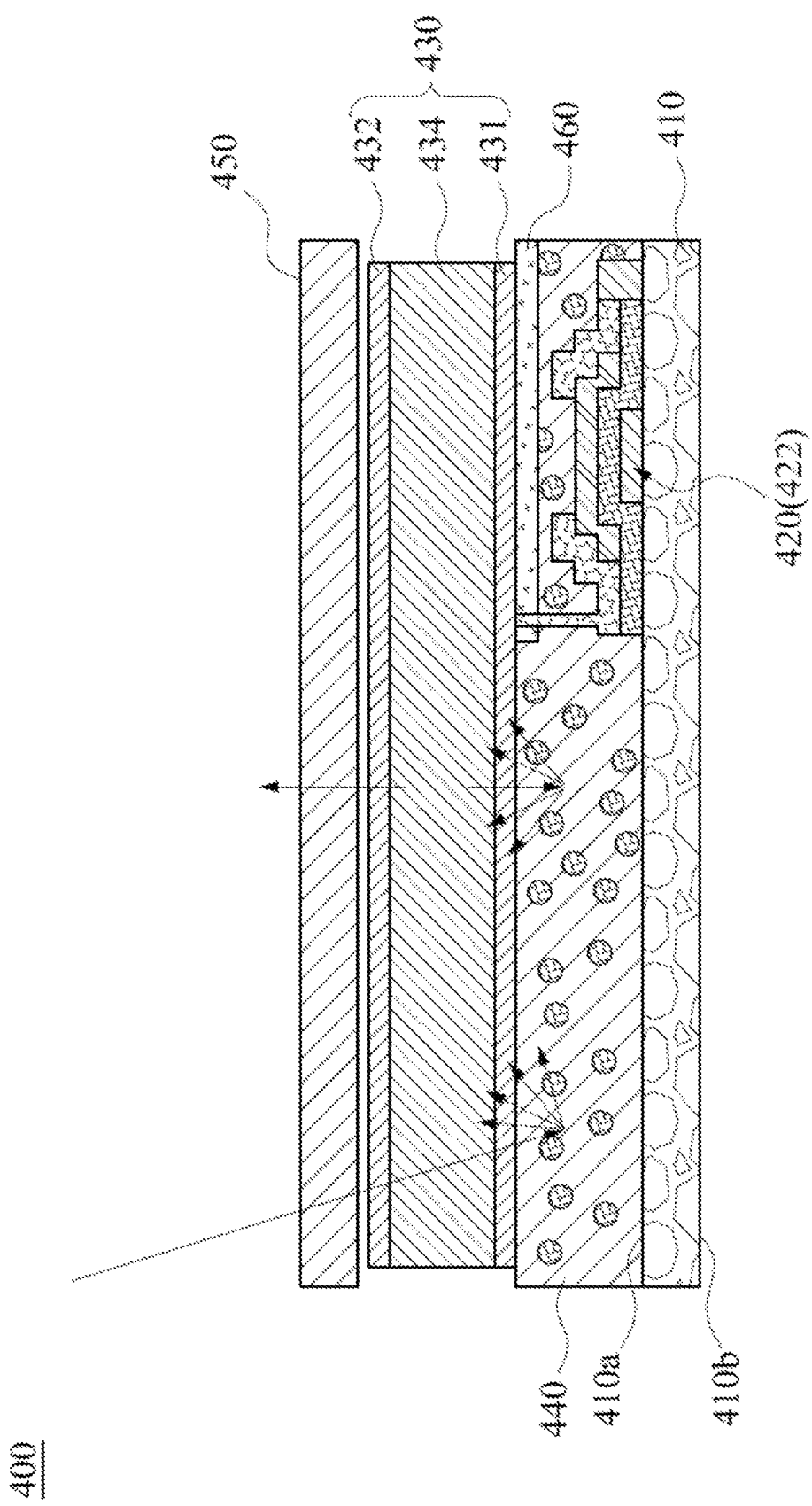

With reference to FIG. 20, in another embodiment, the optical scattering layer 440 is disposed between the upper surface 410a of the substrate 410 and the active element array 420. In still another embodiment, the optical scattering layer 440 is disposed on the lower surface 410b of the substrate 410, as illustrated in FIG. 21. With reference to FIG. 22, in still another embodiment, the optical scattering layer 440 covers and contacts the active element array 420, and the optical scattering layer 440 has the via hole 442 to allow the active element array 420 and the first electrode 431 to be electrically connected with each other through the conductive material filled in the via hole 442. In other words, the optical scattering layer 440 can serve as a protective layer of the active element array 420. Hence, according to the above various embodiments of the present disclosure, the optical scattering layer 440 may be disposed in any layer between the OLED 430 and the upper surface 410a of the substrate 410. In addition, the optical scattering layer 440 may be disposed on the lower surface 410b of the substrate 410.

Figure 23:
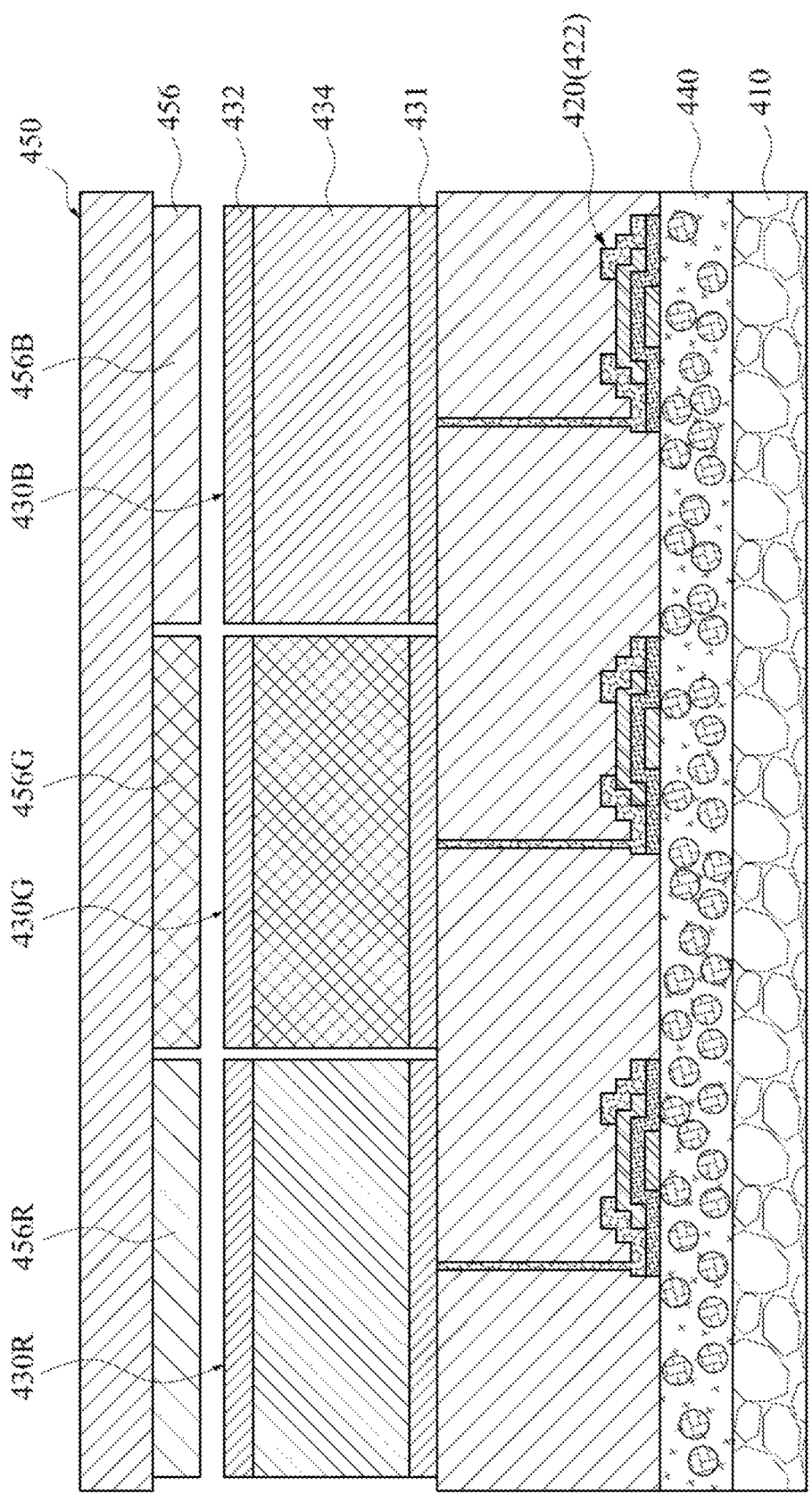
FIG. 23 depicts a cross-sectional schematic diagram of an OLED display device according to one embodiment of this disclosure.

With reference to FIG. 23, according to another embodiment, the encapsulation plate 450 of the OLED display device 400 includes at least one color filter layer 456. The color filter layer 456 includes a red filter layer 456R, a green filter layer 456G, and a blue filter layer 456B. In the present embodiment, the OLED display device 400 includes a red OLED 430R, a green OLED 430G, and a blue OLED 430B. The organic light-emitting layers 434 of the red OLED 430R, the green OLED 430G, and the blue OLED 430B are respectively aligned with the red filter layer 456R, the green filter layer 456G, and the blue filter layer 456B.

The optical scattering layer 440 may be disposed at any position described above and shown in FIG. 19 to FIG. 22 according to the present disclosure, and is not limited to the position of the optical scattering layer 440 depicted in FIG. 23.

The color filter layer 456 itself is a light absorption layer. For example, the red filter layer 456R allows red light to pass through, but light in the other light wave bands will be absorbed. Since the red, green, and blue OLEDs 430R, 430G, 430B are respectively aligned with the red filter layer 456R, the green filter layer 456G, and the blue filter layer 456B, the color filter layer 456 almost does not consume the light self-illuminated from the OLED 430. The color filter layer 456, by contrast, can absorb the light incident from the outside, and the part of the incident light that is not absorbed by the color filter layer 456 passes through the first electrodes 431, the second electrodes 432, and the organic light-emitting layers 434 and finally reaches the optical scattering layer 440, and is diffused and reflected. Hence, the light incident from the outside is absorbed, diffused and reflected to further reduce the reflection strength so as to increase the brightness contrast of the display.

Figure 24:
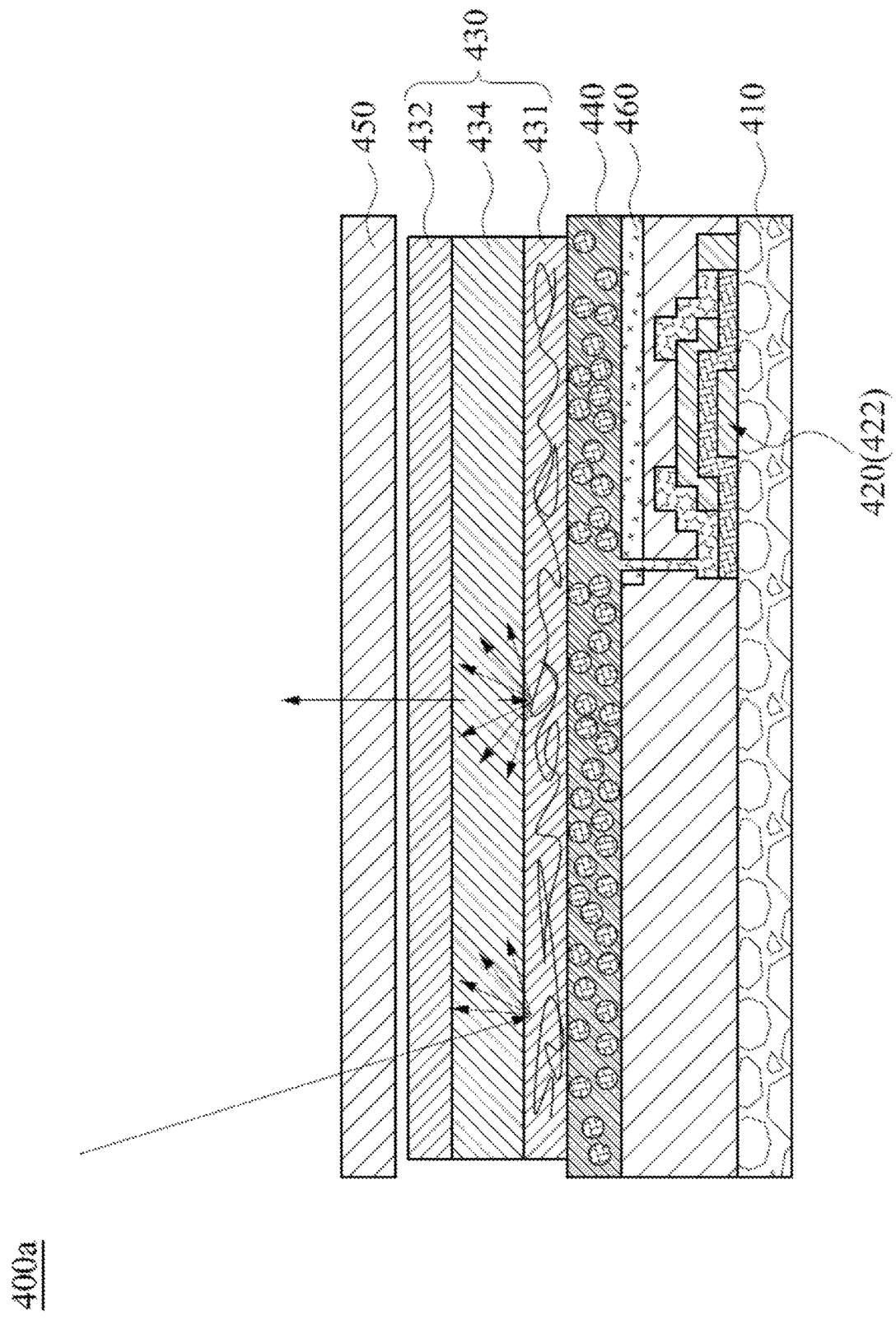
FIG. 24 to FIG. 25 depict cross-sectional schematic diagrams of OLED display devices according to various embodiments of this disclosure.
Figure 25:
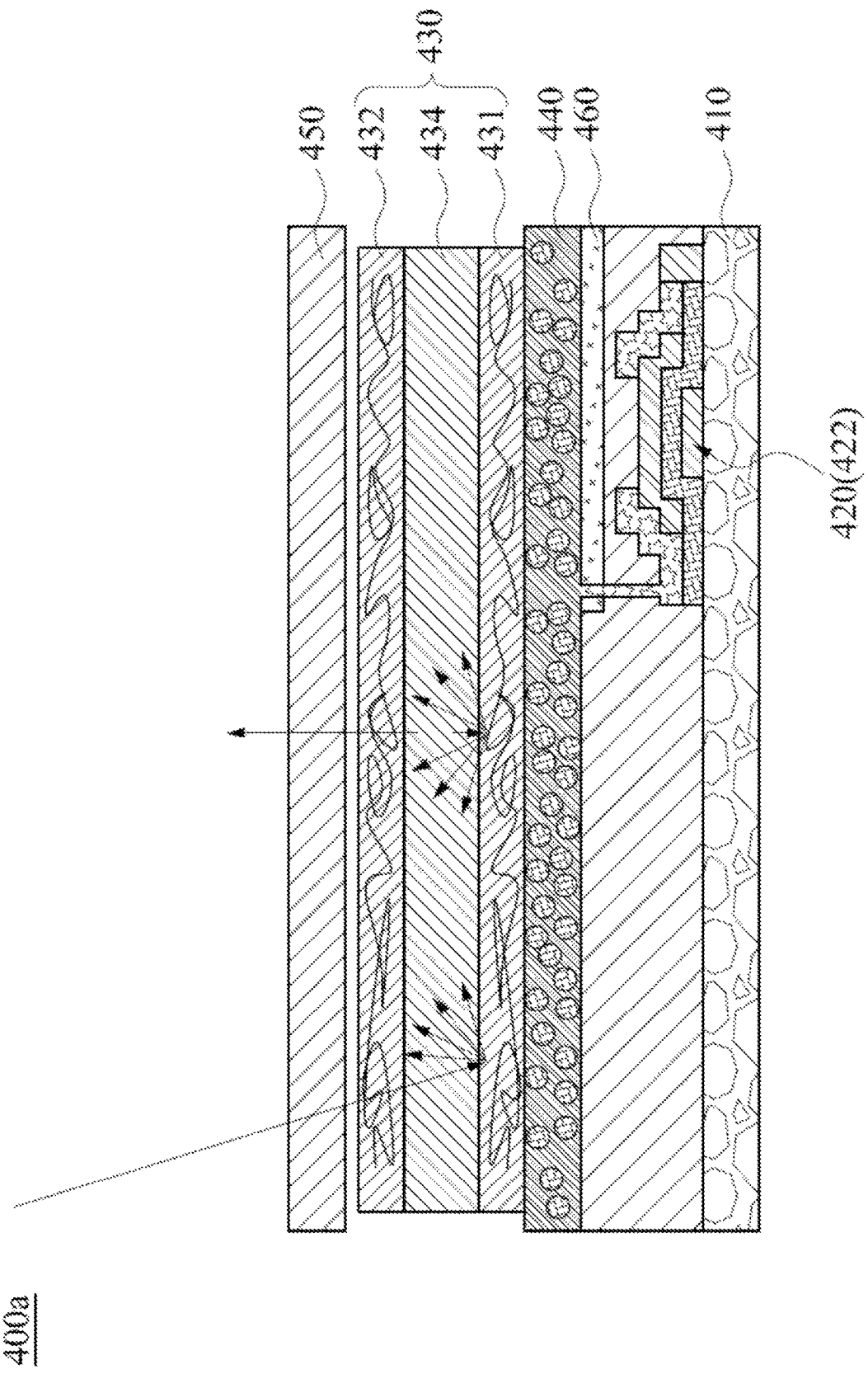

FIG. 24 to FIG. 25 depict cross-sectional schematic diagrams of OLED display devices 400a according to various embodiments of this disclosure. One of the features relies on that at least one electrode of the OLED 430 includes a nanoscale conductive wire. With reference to FIG. 24, the OLED display device 400a includes a substrate 410, an active element array 420, at least one OLED 430, and an encapsulation plate 450. The OLED 430 is disposed above the active element array 420. The OLED 430 includes a first electrode 431, a second electrode 432, and an organic light-emitting layer 434. The first electrode 431 is disposed on a side adjacent to the active element array 420. The first electrode 431 includes a plurality of nanoscale conductive wires for diffusing and reflecting light incident from the environment. The second electrode 432 is opposite to the first electrode 431. The organic light-emitting layer 434 is interposed between the first electrode 431 and the second electrode 432. The substrate 410, the active element array 420, and the encapsulation plate 450 may be the same as these described hereinbefore in connection with the embodiments shown in FIG. 19 to FIG. 22.

The nanoscale conductive wire may be, for example, a silver nano wire (SNW), a carbon nanotube, or some other conductive wire in nanoscale. A diameter of the nanoscale conductive wire may be, for example, about tens of nanometers. A length of the nanoscale conductive wire may be, for example, tens of micrometers. For example, in a conductive film made of silver nano wires, an optical scattering effect can be macroscopically generally because the silver nano wires are stacked in a crossing manner and the silver material is opaque. The optical scattering effect relates to a density of the silver nano wires. The optical scattering effect can be controlled by adjusting the density of the nano silver wires.

As mentioned previously, the conductive material having the high transmittance and the low reflectance is utilized to fabricate the second electrode (upper drive electrode) 432 of the OLED 430, and the conductive material added with the nanoscale conductive wires is utilized to fabricated the first electrode (lower drive electrode) 431 of the OLED 430. The upper drive electrode 432 having this optical property provides the self-luminescence of the OLED 430 with a higher luminous efficiency along the light direction of the display. In addition, as for incident light from the outside, the reflecting effect is reduced because of the low reflectance. Additionally, the first electrode 431 (lower drive electrode) added with the nanoscale conductive wires has the optical scattering effect to allow the incident light from the outside to diffuse because of the scattering effect when reaching the lower drive electrode 431. As a result, the incident light from the outside is scattered. In addition to that, take the silver nano wires for example. The silver material has the capability of reflecting so as to diffuse and reflect light emitted from the OLED upwardly. Hence, not only is the luminous efficiency of the OLED display increased, but the viewing angle of the OLED display is also increased.

In at least one embodiment, the OLED display devices 400a further includes the optical scattering layer 440 for further improving the diffusing and reflecting effect of light. The optical scattering layer 440 may be disposed at any position mentioned previously and shown in FIG. 19 to FIG. 22, and is not limited to the position of the optical scattering layer 440 depicted in FIG. 25.

In another embodiment, as shown in FIG. 25, both the first electrode 431 and the second electrode 432 include a plurality of nanoscale conductive wires for scattering the incident light. In at least one embodiment, the OLED display device 400a further includes the optical scattering layer 440 for further improving the diffusing and reflecting effect of light.

In another embodiment, the optical scattering layer 440 in the embodiments shown in FIG. 19 to FIG. 25 can further be replaced by the light absorption layer 130 mentioned previously and shown in FIG. 1 to FIG. 4 for absorbing incident light to reduce or eliminate the optical reflection that originally would occur.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art of the present disclosure, and will not be interpreted in an idealized or overly formal sense unless expressly so defined herein.

What is claimed is:

1. An organic light-emitting diode display device comprising:
   a substrate having an upper surface and a lower surface opposite the upper surface;
   an active element array disposed on the upper surface side of the substrate;
   at least one organic light-emitting diode (OLED) disposed over the substrate, the OLED comprising:
      a first electrode disposed on a side adjacent to the active element array, wherein an average reflectance of the first electrode in a wavelength range of visible light is less than 0.3;
      a second electrode disposed opposite to the first electrode, wherein an average transmittance of the second electrode in the wavelength range of visible light is greater than 0.6; and
      an organic light-emitting layer interposed between the first electrode and the second electrode;
   a light absorption layer disposed between the OLED and the upper surface of the substrate, or disposed on the lower surface of the substrate; and
   an encapsulation plate disposed over the second electrode.

2. The organic light-emitting diode display device of claim 1, wherein an average transmittance of the first electrode in the wavelength range of visible light is greater than 0.6.

3. The organic light-emitting diode display device of claim 2, wherein the light absorption layer completely covers the active element array, and an average reflectance of the light absorption layer in the wavelength range of visible light is less than 0.3.

4. The organic light-emitting diode display device of claim 1, wherein the light absorption layer completely covers the active element array, and an average reflectance of the light absorption layer in the wavelength range of visible light is less than 0.3.

5. The organic light-emitting diode display device of claim 1, further comprising a sealing layer disposed between the encapsulation plate and the substrate and surrounding the active element array and the OLED.

6. The organic light-emitting diode display device of claim 5, further comprising an electrical connection element, wherein the substrate further includes a signal line electrically connected to the electrical connection element.

7. The organic light-emitting diode display device of claim 6, wherein the electrical connection element and the organic light-emitting layer are disposed on opposite sides of the sealing layer.

8. The organic light-emitting diode display device of claim 1, wherein the light absorption layer is made of an insulating material and disposed between the active element array and the first electrode to cover and contact the active element array, wherein the light absorption layer has at least one via hole, and the active element array and the first electrode are electrically connected through a conductive material filled in the at least one via hole.

9. The organic light-emitting diode display device of claim 1, wherein the light absorption layer is disposed between the active element array and the upper surface of the substrate.

10. The organic light-emitting diode display device of claim 1, wherein an average transmittance of the first electrode in the wavelength range of visible light is less than 0.3.

11. The organic light-emitting diode display device of claim 1, wherein an average transmittance of the first electrode in the wavelength range of visible light is different than the average transmittance of the second electrode in the wavelength range of visible light.

12. An organic light-emitting diode display device comprising:
   a substrate having an upper surface and a lower surface opposite the upper surface;
   an active element array disposed on the upper surface side of the substrate;
   at least one organic light-emitting diode (OLED) disposed over the substrate, the OLED comprising:
      a first electrode disposed on a side adjacent to the active element array;
      a second electrode disposed opposite to the first electrode; and
      an organic light-emitting layer interposed between the first electrode and the second electrode;
   a light absorption layer disposed between the OLED and the upper surface of the substrate, or disposed on the lower surface of the substrate, wherein an average reflectance of the light absorption layer in a wavelength range of visible light is less than 0.3; and
   an encapsulation plate disposed over the second electrode.

13. The organic light-emitting diode display device of claim 12, wherein an average transmittance of the first electrode in the wavelength range of visible light is different than an average transmittance of the second electrode in the wavelength range of visible light.

14. The organic light-emitting diode display device of claim 12, further comprising a sealing layer disposed between the encapsulation plate and the substrate and surrounding the active element array and the OLED such that a first horizontal plane intersect the sealing layer and the active element array and a second horizontal plane intersects the sealing layer and the OLED.

15. The organic light-emitting diode display device of claim 12, further comprising a passivation layer in contact with the active element array and the light absorption layer.

16. The organic light-emitting diode display device of claim 12, wherein the light absorption layer completely covers the active element array.

17. An organic light-emitting diode display device comprising:
   a substrate having an upper surface and a lower surface opposite the upper surface;
   an active element array disposed on the upper surface side of the substrate;
   at least one organic light-emitting diode (OLED) disposed over the substrate, the OLED comprising:

a first electrode disposed on a side adjacent to the active element array;

a second electrode disposed opposite to the first electrode; and an organic light-emitting layer interposed between the first electrode and the second electrode;

a light absorption layer disposed between the OLED and the upper surface of the substrate, or disposed on the lower surface of the substrate;

an encapsulation plate disposed over the second electrode; and a sealing layer disposed between the encapsulation plate and the substrate and surrounding the active element array and the OLED such that a first horizontal plane intersect the sealing layer and the active element array and a second horizontal plane intersects the sealing layer and the OLED.

18. The organic light-emitting diode display device of claim 17, wherein an average transmittance of the first electrode in a wavelength range of visible light is different than an average transmittance of the second electrode in the wavelength range of visible light.

19. The organic light-emitting diode display device of claim 17, further comprising:

a signal line in contact with the upper surface of the substrate;

a touch circuit layer between the encapsulation plate and the light absorption layer; and an electrical connection element extending from the signal line to the touch circuit layer.

20. The organic light-emitting diode display device of claim 19, wherein the electrical connection element is disposed between the sealing layer and the light absorption layer.

* * * * *